(12) United States Patent
Oh et al.

(10) Patent No.: US 8,786,548 B2
(45) Date of Patent: Jul. 22, 2014

(54) INPUT DEVICE AND MOBILE TERMINAL HAVING THE INPUT DEVICE

(75) Inventors: Myungseok Oh, Seoul (KR); Hungchol Chin, Seoul (KR)

(73) Assignee: LG Electronics Inc., Seoul (KR)

( * ) Notice: Subject to any disclaimer, the term of this patent is extended or adjusted under 35 U.S.C. 154(b) by 231 days.

(21) Appl. No.: 12/862,683

(22) Filed: Aug. 24, 2010

(65) Prior Publication Data

US 2011/0169743 A1    Jul. 14, 2011

(30) Foreign Application Priority Data

Jan. 14, 2010 (KR) .................. 10-2010-0003597

(51) Int. Cl.
*G06F 3/0488* (2013.01)

(52) U.S. Cl.
USPC ............................ 345/160; 345/169; 345/158

(58) Field of Classification Search
USPC .................................................. 345/156–184
See application file for complete search history.

(56) References Cited

U.S. PATENT DOCUMENTS

| | | | |
|---|---|---|---|
| 2002/0155857 A1 | 10/2002 | Nishimoto | |
| 2004/0085188 A1* | 5/2004 | Minemura | .................... 340/5.53 |
| 2005/0092900 A1 | 5/2005 | Reime et al. | |
| 2005/0190142 A1* | 9/2005 | Ferguson | ...................... 345/102 |
| 2006/0139775 A1* | 6/2006 | Shibazaki | ...................... 359/819 |
| 2006/0166407 A1* | 7/2006 | Kaushal et al. | ................ 438/115 |
| 2007/0115263 A1 | 5/2007 | Taylor et al. | |
| 2008/0006762 A1* | 1/2008 | Fadell et al. | ................ 250/201.1 |
| 2008/0165115 A1* | 7/2008 | Herz et al. | ...................... 345/102 |
| 2008/0284735 A1* | 11/2008 | Shim | .............................. 345/166 |
| 2009/0077464 A1* | 3/2009 | Goldsmith et al. | ........... 715/257 |
| 2009/0160769 A1* | 6/2009 | Lowles et al. | .................. 345/160 |
| 2009/0272639 A1* | 11/2009 | Mittleman et al. | ............. 200/345 |
| 2009/0278828 A1* | 11/2009 | Fletcher et al. | ................ 345/207 |
| 2010/0066672 A1* | 3/2010 | Schoolcraft et al. | ........... 345/158 |
| 2010/0225628 A1* | 9/2010 | Souchkov et al. | ............. 345/207 |
| 2010/0299642 A1* | 11/2010 | Merrell et al. | ................. 715/863 |

OTHER PUBLICATIONS

European Patent Office Application Serial No. 10175195.6, Search Report dated Jul. 4, 2013, 6 pages.

\* cited by examiner

*Primary Examiner* — Kent Chang
*Assistant Examiner* — William Lu
(74) *Attorney, Agent, or Firm* — Lee, Hong, Degerman, Kang & Waimey

(57) ABSTRACT

An input device and a mobile terminal having the input device are provided. The input device includes a key button with a transparent material having an internal space, an illumination sensor located in an internal space of the key button to sense ambient illumination of the key button, a light-emitting portion located at one side of the illumination sensor to output a light signal to the outside of the key button for detecting a touch applied to the key button, and an input signal generation unit configured to generate a touch input signal according to the light signal being input to a light-receiving portion of the illumination sensor.

19 Claims, 22 Drawing Sheets

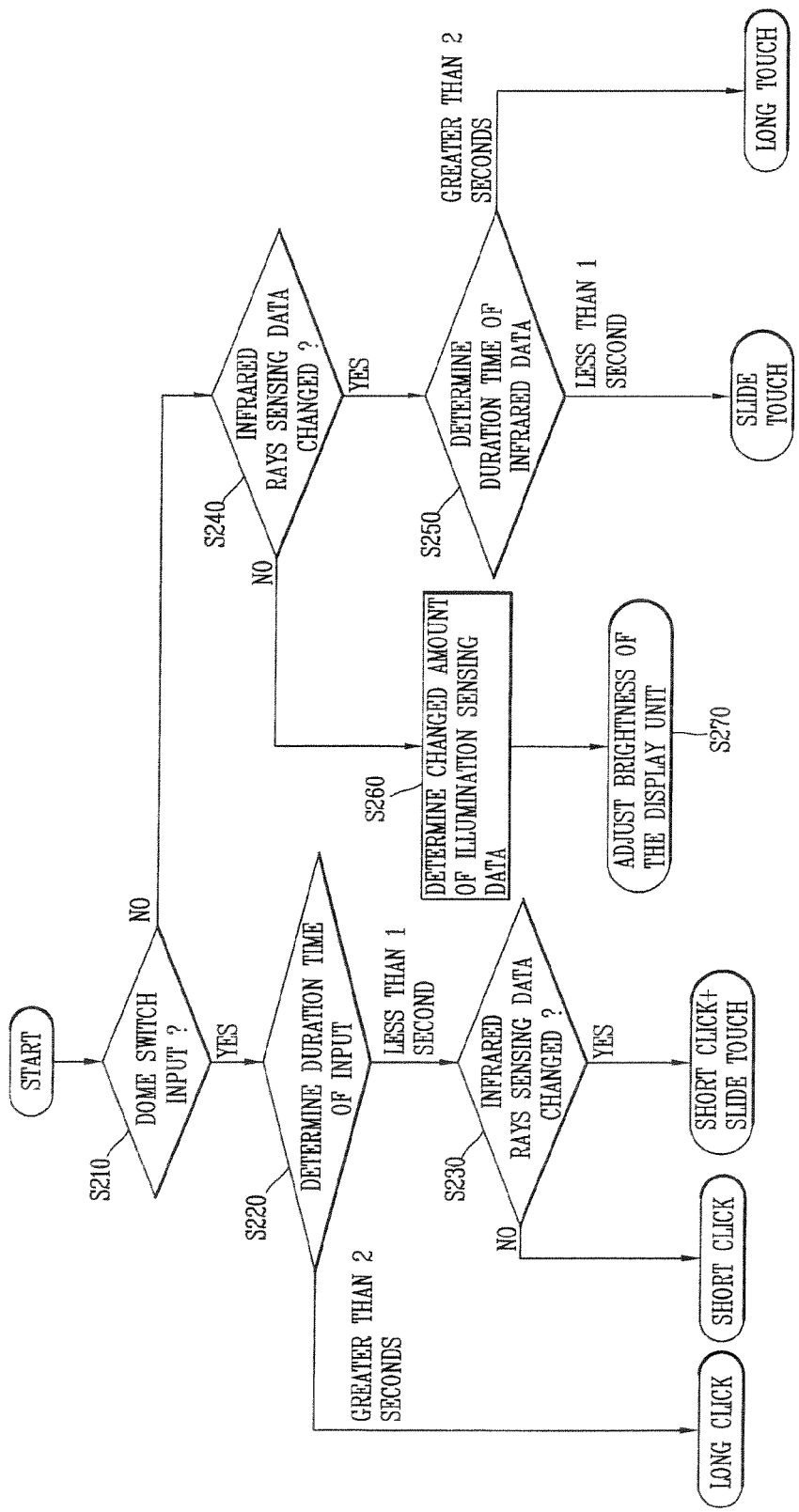

FIG. 12B
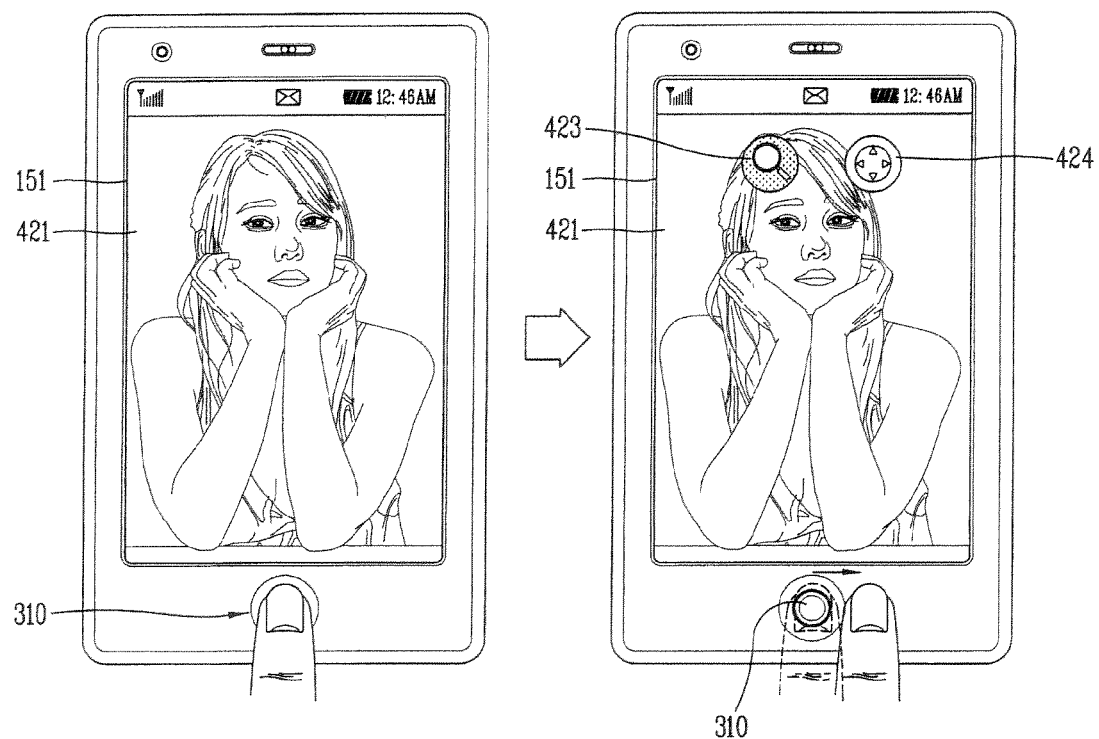
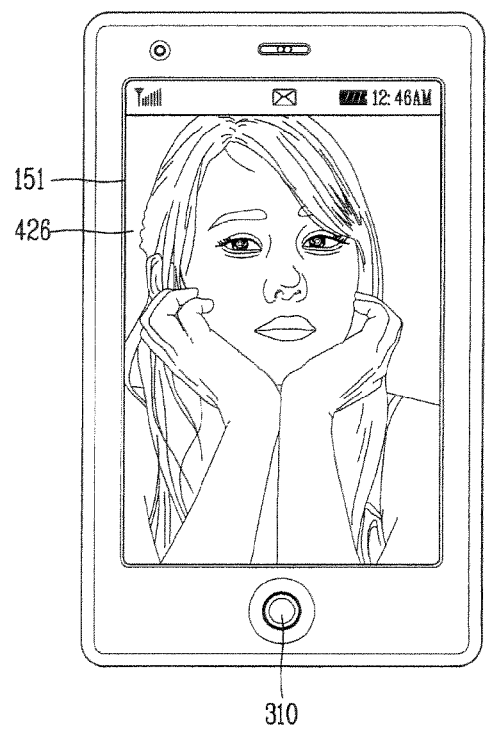

FIG. 15
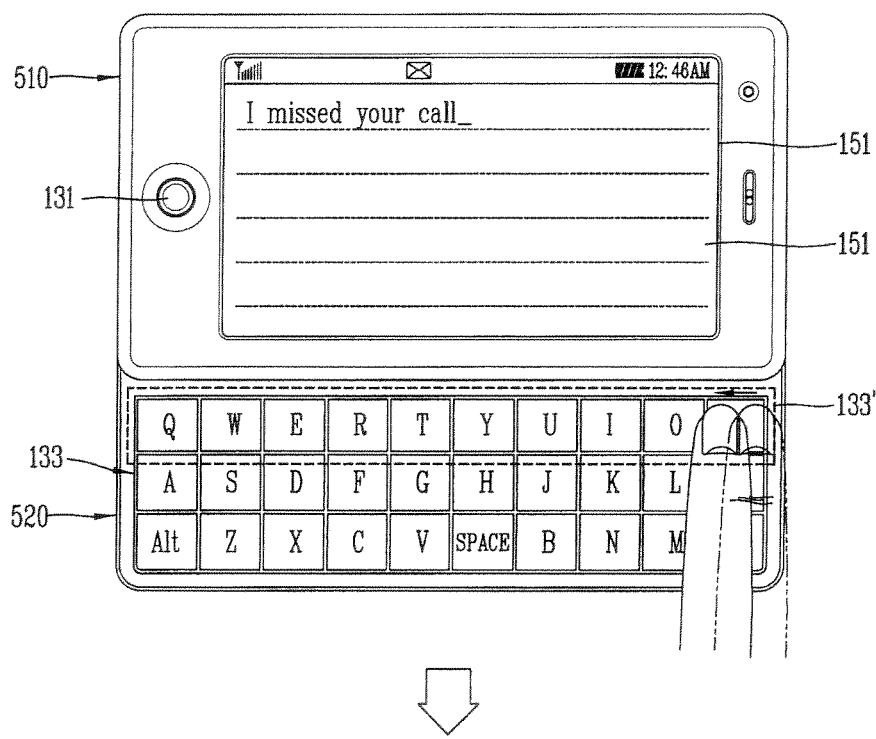
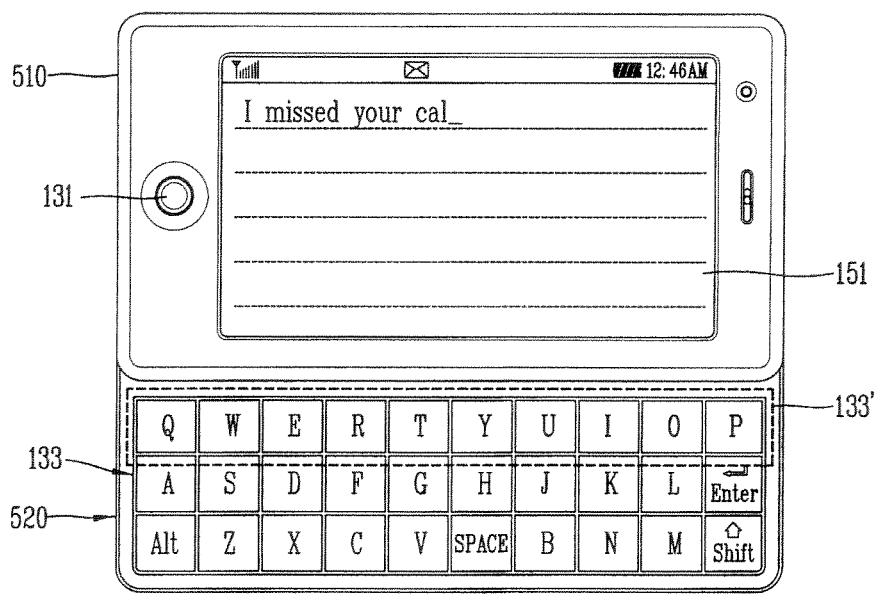

FIG. 16
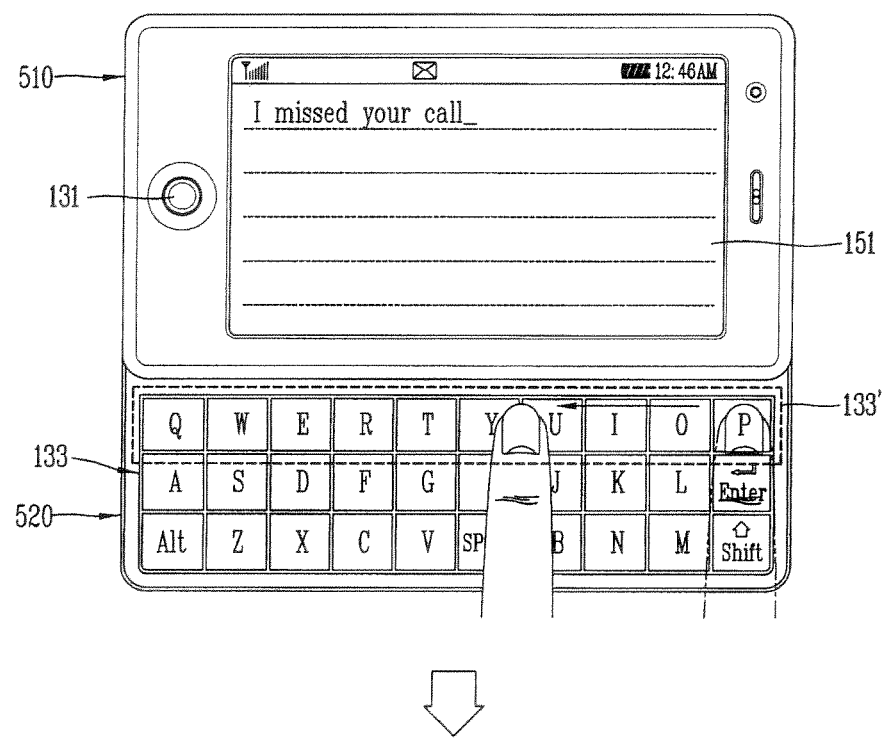
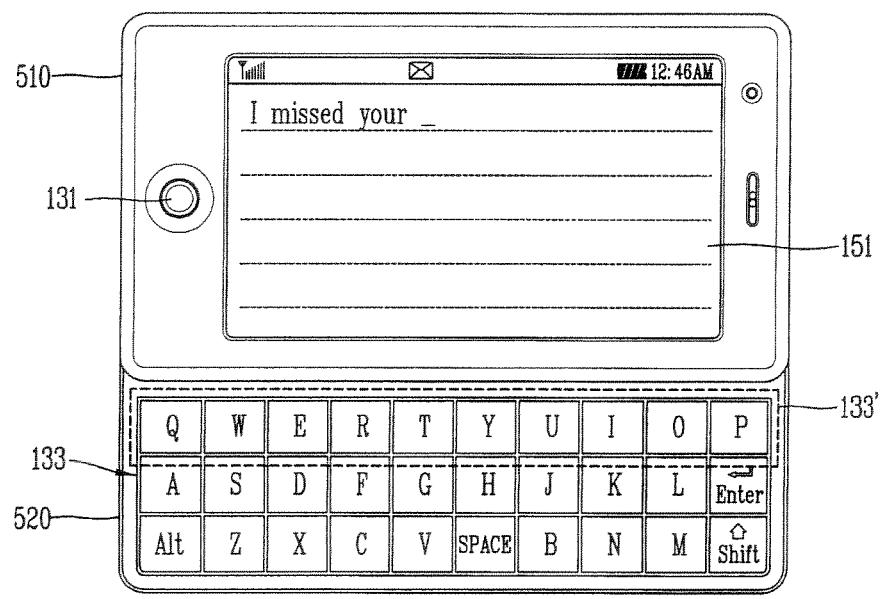

INPUT DEVICE AND MOBILE TERMINAL HAVING THE INPUT DEVICE

CROSS-REFERENCE TO RELATED APPLICATIONS

Pursuant to 35 U.S.C. §119(a), this application claims the benefit of earlier filing date and right of priority to Korean Patent Application No. 10-2010-0035976, filed on Jan. 14, 2010, the entire contents of which is hereby incorporated by reference herein in its entirety.

FIELD OF THE INVENTION

The present invention is directed to an input device using an illumination sensor and a mobile terminal having the input device.

DESCRIPTION OF THE RELATED ART

Terminals can be classified into two types, specifically a mobile terminal and a stationary terminal based on mobility. Furthermore, mobile terminals can be further classified into two types, specifically a handheld terminal and a vehicle mount terminal based on whether or not the mobile terminal can be directly carried by a user.

As terminals become multifunctional, a terminal is able to capture still images or moving images, play music or video files, play games, and receive broadcasts such that they are implemented as an integrated multimedia player. For functional support and enhancement of the terminal, improvements may be considered in structural and/or software aspects of the terminal.

A mobile terminal may include an input device for inputting information. The input device may be implemented in various forms, such as a dome switch, a touch pad, a touch screen, or a jog wheel.

SUMMARY OF THE INVENTION

In one aspect of the present invention, a mobile terminal is provided. The mobile terminal includes a terminal body and an input device mounted on the terminal body, wherein the input device includes at least one key button formed of a transparent material and having an internal space, an illumination sensor located in the internal space and having a light-receiving portion, the illumination sensor configured to sense ambient illumination of the terminal body, a light-emitting portion located at a side of the illumination sensor and configured to output a light signal to the outside of the key button for detecting a touch applied to the at least one key button and an input signal generation unit configured to generate a touch input signal according to the light signal input to the light-receiving portion of the illumination sensor.

It is contemplated that the light-emitting portion is an infrared-emitting module configured to emit infrared rays. It is further contemplated that the light-emitting portion includes a first light-emitting portion mounted at a first side of the illumination sensor and second light-emitting portion mounted at a second side of the illumination sensor to detect a slide touch applied to the at least one key button.

It is contemplated that the input signal generation unit generates a different input signal according to the direction of the slide touch. It is further contemplated that the mobile terminal further includes a spacer with an elastically deformable material between the illumination sensor and an internal wall of the at least one key button.

It is contemplated that the mobile terminal further includes a display unit mounted on the terminal body and configured to display visual information and a brightness adjustment unit configured to adjust a brightness of the display unit according to the ambient illumination sensed by the illumination sensor. It is further contemplated that the mobile terminal further includes a controller configured to control activation or deactivation of the brightness adjustment unit according to a changed intensity of the light signal input to the light-receiving portion of the illumination sensor.

It is contemplated that the controller is further configured to deactivate the brightness adjustment unit if an intensity of the light signal is changed when the brightness adjustment unit is activated. It is further contemplated that the mobile terminal further includes a dome switch configured to generate a push input signal according to the at least one key button being pressed and a controller configured to apply a control command to components mounted on the terminal body according to the touch input signal and push input signal.

It is contemplated that the controller is further configured to apply a different control command for each of a touch input, a push input, and a sequential push-and-touch input. It is further contemplated that the touch input includes a slide touch made by sliding a finger on the at least one key button and the controller is further configured to apply a different control command according to the direction of the slide touch.

It is contemplated that a plurality of key information is displayed on the at least one key button and at least two of the touch input, push input, and sequential push-and-touch input are assigned to one of the plurality of key information. It is further contemplated that the controller is further configured to apply a different control command according to a duration time of at least the push input or touch input.

It is contemplated that one of the components mounted on the terminal body is a display unit for displaying visual information and the controller is further configured to apply a control command for controlling a screen display of the display unit according to the push input and touch input. It is further contemplated that the control command includes at least a command for restoring a preset screen during the execution of a specific mode, a command for executing a selected operation, a command for displaying upper-level items of a currently-executed function, a command for displaying a menu, a command for switching to a next or previous page, a command for moving a cursor or pointer, a command for scrolling the screen display in a specific direction, or a zoom-in or zoom-out command.

It is contemplated that the touch includes a slide touch made by sliding a finger on the at least one key button and the slide touch is assigned to a command for deleting text in a text editing mode. It is further contemplated that a plurality of key buttons are arranged to form at least one column on the terminal body and the text is deleted according to a number of text characters corresponding to a number of the slide-touched key buttons.

In another aspect of the present invention, an input device is provided. The input device includes a key button formed of a transparent material and having an internal space, an illumination sensor located in the internal space and having a light-emitting portion, the illumination sensor configured to sense ambient illumination of the key button, a light-emitting portion located at one side of the illumination sensor and configured to output a light signal to the outside of the key button for detecting a touch applied to the key button and an input signal generation unit configured to generate a touch input signal according to the light signal input to the light-receiving portion of the illumination sensor.

It is contemplated that the light-emitting portion is an infrared-emitting module configured to emit infrared rays. It is further contemplated that the input device further includes a display unit mounted on the terminal body and configured to display visual information and a brightness adjustment unit configured to adjust a brightness of the display unit according to the ambient illumination sensed by the illumination sensor.

Additional features and advantages of the invention will be set forth in the description which follows, and in part will be apparent from the description, or may be learned by practice of the invention. It is to be understood that both the foregoing general description and the following detailed description of the present invention are exemplary and explanatory and are intended to provide further explanation of the invention as claimed.

These and other embodiments will also become readily apparent to those skilled in the art from the following detailed description of the embodiments having reference to the attached figures, the invention not being limited to any particular embodiments disclosed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 10 is a flow chart illustrating a method of generating an input signal in a mobile terminal according to the present invention.

FIGS. 12A through 12E are views illustrating examples of an input method via an input device in an image view mode according to the present invention.

FIGS. 15 and 16 are views illustrating an operation method of the mobile terminal illustrated in FIG. 14.

DETAILED DESCRIPTION OF THE PREFERRED EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

The present invention is applicable to a various types of mobile terminals. Examples of such mobile terminals include portable phones, E-books, smart phones, laptop computers, digital broadcast terminals, personal digital assistants (PDA), portable multimedia players (PMP) and navigators.

Figure 1:
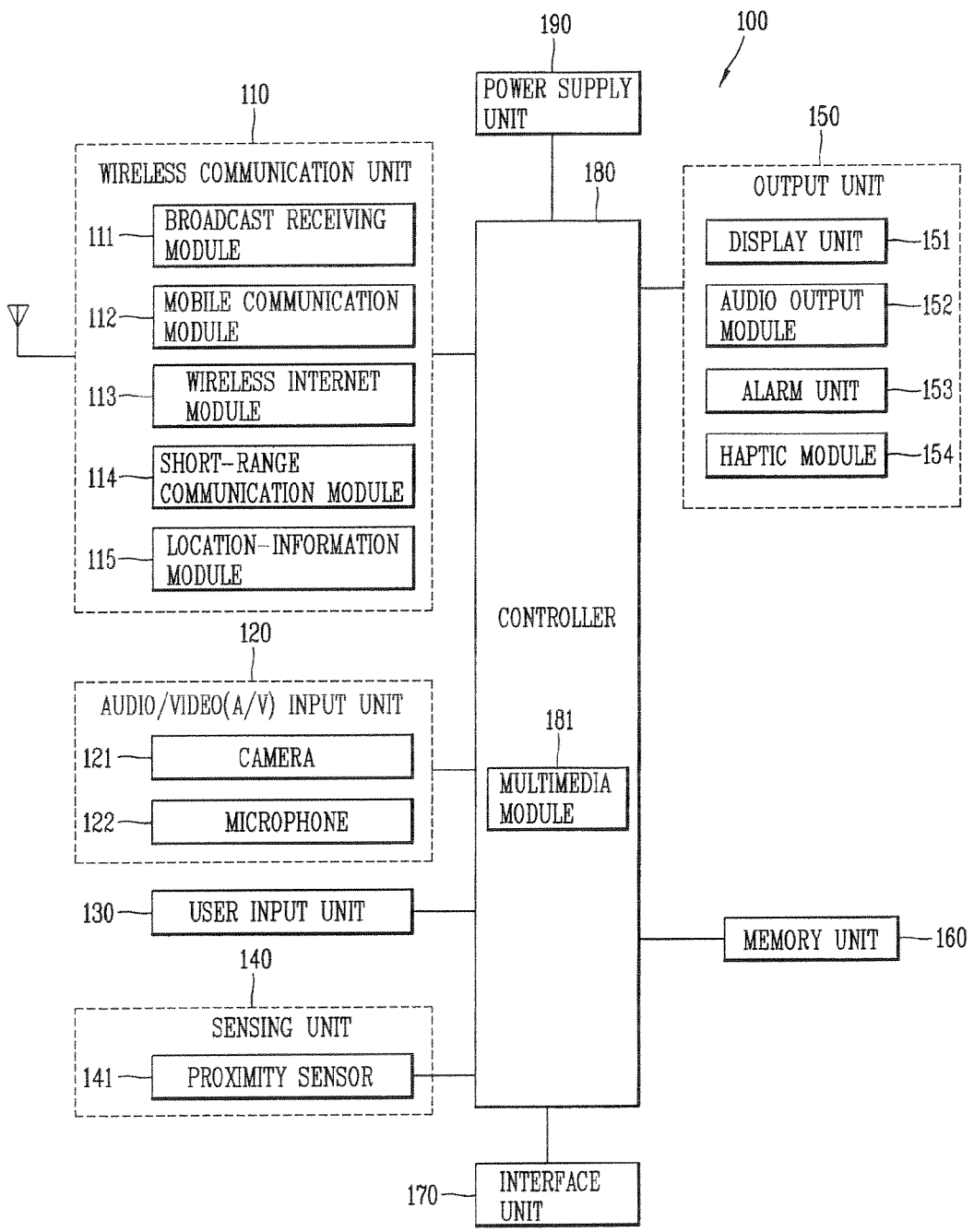
FIG. 1 is a block diagram illustrating a mobile terminal according to an embodiment of the present invention.

Referring to FIG. 1, a mobile terminal 100 according to one embodiment of the present invention includes a wireless communication unit 110, an A/V (audio/video) input unit 120, a user input unit 130, a sensing unit 140, an output unit 150, a memory unit 160, an interface unit 170, a controller 180, and a power supply unit 190. FIG. 1 shows the mobile terminal 100 having various components, but it is understood that implementing all of the illustrated components is not a requirement. Greater or fewer components may alternatively be implemented.

FIG. 1 shows a wireless communication unit 110 configured with several commonly implemented components. For example, the wireless communication unit 110 typically includes one or more components that permit wireless communication between the mobile terminal 100 and a wireless communication system or network within which the mobile terminal is located.

The wireless communication unit 110 can include a broadcast receiving module 111, a mobile communication module 112, a wireless Internet module 113, a short-range communication module 114, and a position-location module 115. At least two broadcast receiving modules 111 can be provided to facilitate simultaneous reception of at least two broadcast channels or broadcast channel switching.

The broadcast receiving module 111 receives a broadcast signal and/or broadcast associated information from an external broadcast managing server via a broadcast channel. The broadcast channel may include a satellite channel or a terrestrial channel.

The broadcast managing server refers generally to a system that transmits a broadcast signal and/or broadcast associated information or a server which is provided with a previously generated broadcast signal and/or broadcast associated information. The broadcast messaging server then transmits the provided signal or information to a terminal.

Examples of broadcast associated information include information associated with a broadcast channel, a broadcast program, and a broadcast service provider. For example, the broadcast associated information may include an electronic program guide (EPG) of digital multimedia broadcasting (DMB) and electronic service guide (ESG) of digital video broadcast-handheld (DVB-H).

The broadcast signal may be implemented as a TV broadcast signal, a radio broadcast signal, or a data broadcast signal. The broadcast signal may further include a broadcast signal combined with a TV or radio broadcast signal.

The broadcast receiving module 111 may be configured to receive broadcast signals transmitted from various types of broadcast systems. By way of non-limiting examples, such broadcasting systems include digital multimedia broadcasting-terrestrial (DMB-T), digital multimedia broadcasting-satellite (DMB-S), digital video broadcast-handheld (DVB-H), DVB-CBMS, OMA-BCAST, the data broadcasting system known as media forward link only (MediaFLO®) and integrated services digital broadcast-terrestrial (ISDB-T).

Receiving multicast signals is also possible. Data received by the broadcast receiving module 111 may be stored in a suitable device, such as the memory unit 160.

The mobile communication module 112 communicates wireless signals with one or more network entities, such as base station or Node-B. Such signals may represent, for example, audio, video, multimedia, control signaling, or data.

The wireless Internet module 113 supports Internet access for the mobile terminal 100. The wireless Internet module 113 may be internally or externally coupled to the mobile terminal 100. The wireless Internet technology can include, for example, WLAN (Wireless LAN) (Wi-Fi), Wibro (Wireless broadband), Wimax (World Interoperability for Microwave Access), or HSDPA (High Speed Downlink Packet Access).

The short-range communication module 114 facilitates relatively short-range communications. Suitable technologies for short-range communication may include, but are not limited to, radio frequency identification (RFID), infrared data association (IrDA), ultra-wideband (UWB), as well at the networking technologies commonly referred to as Bluetooth® and ZigBee®.

The position-location module 115 identifies or otherwise obtains the location of the mobile terminal 100. The position-location module 115 may be implemented using a global positioning system (GPS) module.

The audio/video (A/V) input unit 120 is configured to provide audio or video signal input to the mobile terminal 100. As shown, the A/V input unit 120 includes a camera 121 and a microphone 122.

The camera 121 receives and processes image frames of still pictures or video, which are obtained by an image sensor in a video call mode or a photographing mode. The processed image frames can be displayed on the display unit 151. The image frames processed by the camera 121 can be stored in the memory unit 160 or can be externally transmitted via the wireless communication unit 110.

The microphone 122 receives an external audio signal while the mobile terminal 100 is in a particular mode, such as phone call mode, recording mode or voice recognition mode. This audio signal is processed and converted into digital data. The processed audio data is transformed into a format transmittable to a mobile communication base station via the mobile communication module 112 in a call mode. The microphone 122 typically includes assorted noise removing algorithms to remove noise generated in the course of receiving the external audio signal.

Data generated by the A/V input unit 120 may be stored in the memory unit 160, utilized by the output unit 150, or transmitted via one or more modules of the wireless communication unit 110. If desired, two or more cameras 121 or microphones 122 may be provided.

The user input unit 130 generates input data responsive to user manipulation of an associated input device or devices. Examples of such devices include a keypad, a dome switch, a touchpad such as static pressure/capacitance, a jog wheel and a jog switch.

The sensing unit 140 provides status measurements of various aspects of the mobile terminal 100. For example, the sensing unit 140 may detect an open/close status of the mobile terminal 100, the relative positioning of components such as a display and keypad, a change of position of the mobile terminal or a component of the mobile terminal, a presence or absence of user contact with the mobile terminal, or orientation or acceleration/deceleration of the mobile terminal. The sensing unit 140 can include a proximity sensor 141.

The mobile terminal 100 may be configured as a slide-type mobile terminal and the sensing unit 140 may sense whether a sliding portion of the mobile terminal is open or closed. The sensing unit 140 may also sense the presence or absence of power provided by the power supply unit 190 or the presence or absence of a coupling or other connection between the interface unit 170 and an external device.

The output unit 150 generates outputs relevant to the senses such as sight, hearing, and touch. The output unit 150 is illustrated in FIG. 1 as having a display unit 151, an audio output module 152, an alarm unit 153, and a haptic module 154.

The display unit 151 is typically implemented to visually display (output) information associated with the mobile terminal 100. For example, if the mobile terminal 100 is operating in a phone call mode, the display unit 151 will generally provide a user interface (UI) or graphical user interface (GUI) that includes information associated with placing, conducting, and terminating a phone call. If the mobile terminal 100 is in a video call mode or a photographing mode, the display unit 151 may additionally or alternatively display images which are associated with these modes, the UI or the GUI.

One particular implementation of the present invention includes the display unit 151 configured as a touch screen working in cooperation with an input device, such as a touchpad. This configuration permits the display unit 151 to function both as an output device and an input device.

The display unit 151 may be implemented using known display technologies including a liquid crystal display (LCD), a thin film transistor-liquid crystal display (TFT-LCD), an organic light-emitting diode display (OLED), a flexible display and a three-dimensional display. The mobile terminal 100 may include one or more display unit 151.

Some of the display units 151 can be implemented as a transparent or optical transmittive type, which can be called a transparent display. The transparent display may be a TOLED (transparent OLED). A rear configuration of the display 151 unit can be implemented as an optical transmittive type as well. In this configuration, a user is able to see an object at the rear of the terminal body via the area occupied by the display unit 151.

At least two display units 151 can be provided in accordance with the implemented configuration of the mobile terminal 100. For example, a plurality of display units 151 can be arranged on a single face of the mobile terminal 100 such that they are spaced apart from each other or built in one body. Alternatively, a plurality of display units 151 can be arranged on different faces of the mobile terminal 100.

If the display unit 151 and a sensor for detecting a touch action (hereinafter called 'touch sensor') form a mutual layer structure such as a touch screen, the touch sensor can be configured as a touch film, a touch sheet, or a touchpad. The touch sensor can be configured to convert a pressure applied to a specific portion of the display unit 151 or a variation of a capacitance generated from a specific portion of the display unit into an electric input signal. Furthermore, the touch sensor may be configured to detect a pressure of a touch as well as a touched position or size.

If a touch input is made to the touch sensor, signal(s) corresponding to the touch are transferred to a touch controller (not shown). The touch controller processes the signal(s) and then transfers the processed signal(s) to the controller 180. The controller 180 is able to determine whether a specific portion of the display unit 151 is touched.

The proximity sensor 141 can be provided at an internal area of the mobile terminal 100 enclosed by the touch screen or around the touch screen. The proximity sensor 141 is a sensor that detects a presence or non-presence of an object approaching a specific detecting surface or an object existing around the proximity sensor using an electromagnetic field strength or infrared ray without mechanical contact. Therefore, the proximity sensor 141 is more durable than a contact type sensor and also provides wider utility than a contact type sensor.

The proximity sensor 141 may include a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, an infrared proximity sensor or similar sensors. If the touch screen includes an electrostatic capacity proximity sensor, it is configured to detect the proximity of a pointer using a variation of electric field according to the proximity of the pointer. In this case, the touch screen (touch sensor) can be classified as the proximity sensor 141.

In the following description, an action where a pointer that approaches without contacting the touch screen is recognized as located on the touch screen is called a 'proximity touch'. Furthermore, an action where a pointer actually touches the touch screen is called a 'contact touch'. The meaning of a position on the touch screen proximity-touched by the pointer is a position of the pointer that vertically opposes the touch screen when the pointer performs the proximity touch.

The proximity sensor 141 detects a proximity touch and a proximity touch pattern (e.g., a proximity touch distance, a proximity touch duration, a proximity touch position, or a proximity touch shift state). Information corresponding to the detected proximity touch and the detected proximity touch pattern can be output to the touch screen.

The audio output module 152 supports the audio output requirements of the mobile terminal 100. The audio output module 152 may be implemented using one or more speakers, buzzers, other audio producing devices, or combinations thereof.

The audio output module 152 functions in various modes such as call-receiving mode, call-placing mode, recording mode, voice recognition mode and broadcast reception mode. The audio output module 152 outputs audio relating to a particular function or status, such as call received, message received, or errors.

The alarm unit 153 may signal or otherwise identify the occurrence of a particular event associated with the mobile terminal 100. Typical events include call received, message received and user input received.

The alarm unit 153 outputs a signal for announcing the event occurrence via vibration as well as via video or audio signal. The video or audio signal can be output via the display unit 151 or the audio output unit 152. Therefore, the display unit 151 or the audio output module 152 can be regarded as a part of the alarm unit 153.

The haptic module 154 generates various tactile effects that can be sensed by a user. Vibration is a representative one of the tactile effects generated by the haptic module 154. Strength and pattern of the vibration generated by the haptic module 154 are controllable. For example, different vibrations may be output by being synthesized together or may be output in sequence.

The haptic module 154 is able to generate various tactile effects as well as vibration. For example, the haptic module 154 may generate the effect of an arrangement of pins vertically moving against a contact skin surface, the effect of an injection/suction power of air though an injection/suction hole, the effect of skimming over a skin surface, the effect of contact with an electrode, the effect of electrostatic force, or the effect of hot/cold using an endothermic or exothermic device.

The haptic module 154 can be implemented to enable a user to sense the tactile effect through a muscle sense of a finger, an arm or other body part as well as to transfer the tactile effect through a direct contact. At least two haptic modules 154 can be provided in the mobile terminal 100 in accordance with the corresponding configuration of the mobile terminal.

The memory unit 160 is generally used to store various types of data to support the processing, control, and storage requirements of the mobile terminal 100. Examples of such data include program instructions for applications operating in the mobile terminal 100, contact data, phonebook data, messages, pictures, and video.

A recent use history or a cumulative use frequency of each data (e.g., use frequency for each phonebook, each message or each multimedia) can be stored in the memory unit 160. Moreover, data for various patterns of vibration and/or sound output in case of a touch input to the touchscreen can be stored in the memory unit 160.

The memory unit 160 may be implemented using any type or combination of suitable volatile and non-volatile memory or storage devices. Examples of memory types are random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk memory, multimedia card micro type memory, card-type memory (e.g., SD memory, XD memory), and other similar memory or data storage devices. The mobile terminal 100 may operate in association with web storage for performing a storage function of the memory unit 160 on the Internet.

The interface unit 170 is often implemented to couple the mobile terminal 100 with external devices. The interface unit 170 receives data from the external devices or is supplied with power and then transfers the data or power to the respective elements of the mobile terminal 100 or enables data within the mobile terminal 100 to be transferred to the external devices. The interface unit 170 may be configured using a wired/wireless headset port, an external charger port, a wired/wireless data port, a memory card port, a port for coupling to a device having an identity module, audio input/output ports, video input/output ports, or an earphone port.

The identity module is a chip for storing various kinds of information for authenticating a user's authority to use the mobile terminal 100 and can include a User Identify Module (UIM), a Subscriber Identity Module (SIM), or a Universal Subscriber Identity Module (USIM). A device having the identity module (hereinafter called 'identity device') can be manufactured as a smart card. Therefore, the identity device is connectible to the mobile terminal 100 via a corresponding port.

When the mobile terminal 110 is connected to an external cradle, the interface unit 170 provides a passage for supplying the mobile terminal 100 with power from the cradle or a passage for delivering various command signals to the mobile terminal 100 that are input from the cradle by a user. Each of the various command signals input from the cradle or the power can operate as a signal enabling the mobile terminal 100 to determine that it is correctly loaded in the cradle.

The controller 180 typically controls the overall operations of the mobile terminal 100. For example, the controller 180 performs the control and processing associated with voice calls, data communications, instant message communication, video calls, camera operations and recording operations. Furthermore, the controller 180 may perform a pattern recognizing process for recognizing a writing input and a picture drawing input performed on the touch screen as characters or images.

The controller 180 may include a multimedia module 181 that provides multimedia playback. The multimedia module 181 may be configured as part of the controller 180 or implemented as a separate component.

The power supply unit 190 provides power required by the various components for the mobile terminal 100. The power may be internal power, external power, or combinations thereof.

Various embodiments described herein may be implemented in various ways. For example, the embodiments may be implemented in a computer-readable medium using computer software, hardware, or some combination thereof.

For a hardware implementation, the embodiments described may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination of these devices. The controller 180 may also implement such embodiments.

For a software implementation, the embodiments described herein may be implemented with separate software modules, such as procedures and functions, each of which perform one or more of the functions and operations described herein. The software codes can be implemented with a software application written in any suitable programming language and may be stored in memory, such as the memory unit 160, and executed by a controller or processor, such as the controller 180.

Figure 2A:
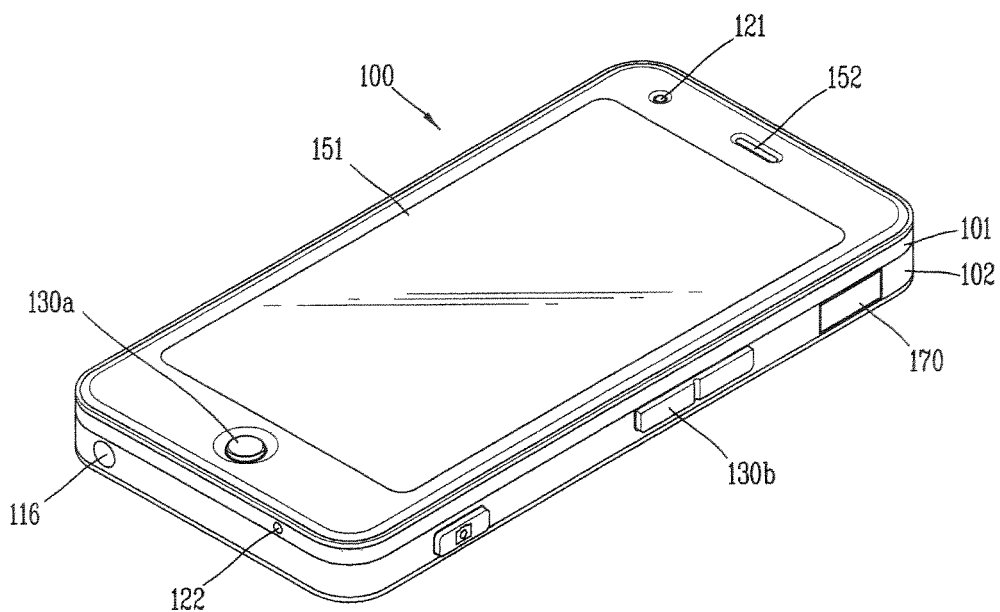
FIG. 2A is a front perspective view illustrating a portable terminal according to an embodiment of the present invention.
Figure 2B:
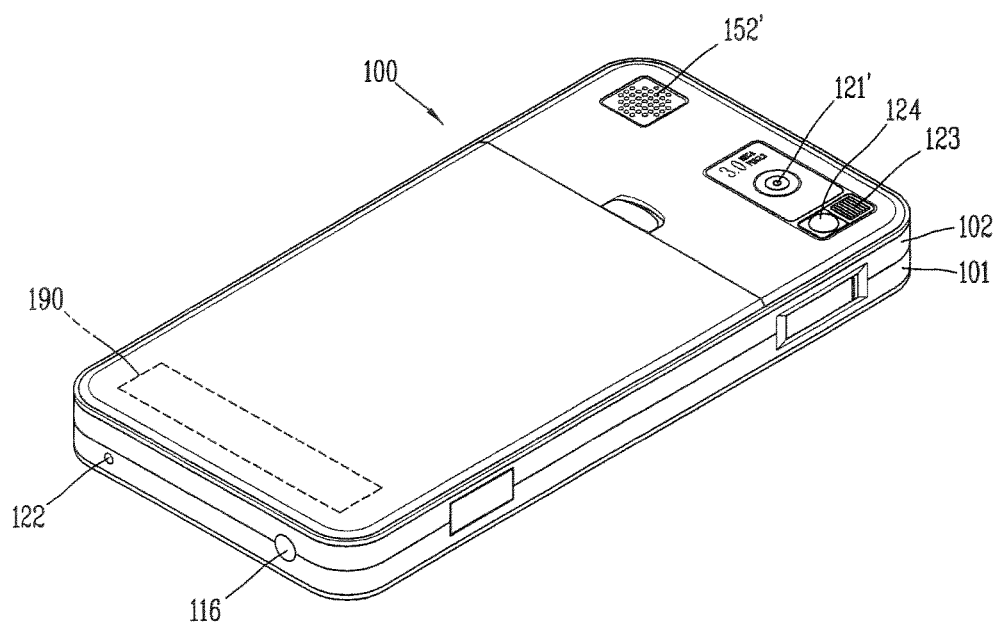
FIG. 2B is a rear perspective view illustrating a portable terminal according to an embodiment of the present invention.

FIG. 2A is a front perspective diagram of a mobile terminal according to one embodiment of the present invention. FIG. 2B is a perspective diagram of a backside of the terminal shown in FIG. 2A.

The mobile terminal 100 illustrated in FIGS. 2A and 2B has a bar type terminal body. However, the mobile terminal 100 may be implemented in a variety of different configurations. Examples of such configurations include folder-type, slide-type, rotational-type, swing-type and combinations thereof. For clarity, further disclosure will primarily relate to a bar-type mobile terminal 100. However such teachings apply equally to other types of mobile terminals.

As illustrated in to FIG. 2A, the mobile terminal 100 includes a case (casing, housing, cover, etc.) configuring an exterior of the mobile terminal. The case can be divided into a front case 101 and a rear 102 case. Various electric/electronic parts are located in a space between the front 101 and rear 102 cases. Optionally, at least one middle case can be provided between the front 101 and rear 102 cases.

The cases 101 and 102 may be formed by injection molding synthetic resin. The cases 101 and 102 may also be formed of a metal substance such as stainless steel (STS) or titanium (Ti). The display 151, audio output unit 152, camera 121, manipulating units 130a and 130b, microphone 122, and interface unit 170 can be provided on the terminal body, specifically on the front case 101.

The display 151 occupies most of a main face of the front case 101. The audio output unit 152 and the camera 121 are provided on an area adjacent to one of the end portions of the display 151, while one manipulating input unit 130a and the microphone 122 are provided on another area adjacent to the other end portion of the display. The other manipulating unit 130b and the interface unit 170 can be provided on lateral sides of the front and rear cases 101 and 102.

The input unit 130 is manipulated to input a command for controlling an operation of the terminal 100 and may include the manipulating units 130a and 130b. The manipulating units 130a and 130b can be called a manipulating portion and may adopt any mechanism having a tactile manner that enables a user to perform a manipulation action by experiencing a tactile feeling.

Content input via the first or second manipulating unit 130a or 130b can be diversely set. For example, a command such as start, end, or scroll is input via the first manipulating unit 130a and a command for a volume adjustment of sound output from the audio output unit 152 or a command for switching to a touch recognizing mode of the display 151 can be input via the second manipulating unit 130b.

As illustrated in FIG. 2B, an additional camera 121' can be provided on a rear side of the terminal body, specifically on the rear case 102. The camera 121' has a photographing direction that is substantially opposite to that of the camera 121 illustrated in FIG. 2A and may have pixels differing from those of the camera 121.

Preferably, the camera 121 illustrated in FIG. 2A has pixels low enough to capture and transmit a picture of user's face for a video call, while the camera 121' has high pixels for capturing a general subject for photography without transmitting the captured subject. Each of the cameras 121 and 121' can be installed such that they can be rotated or popped up.

A flash 123 and a mirror 124 are additionally provided adjacent to the camera 121'. The flash 123 projects light toward a subject for photographing the subject using the camera 121'. If user attempts to take a self-photography using the camera 121', the mirror 124 enables the user to view his or her face reflected by the mirror 124.

An additional audio output unit 152' can be provided on the rear side of the terminal body. The additional audio output unit 152' may implement a stereo function together with the audio output unit 152 illustrated in FIG. 2A and may be used for implementation of a speakerphone mode while talking.

A broadcast signal receiving antenna 124 can be provided on the lateral side of the terminal body as well as an antenna for communication. The antenna 124 comprising a portion of the broadcast receiving module 111 illustrated in FIG. 1 can be retractably provided on the terminal body.

A power supply unit 190 for supplying power to the mobile terminal 100 is provided. The power supply unit 190 can be configured to be located within the terminal body. Alternatively, the power supply unit 190 can be configured to be detachably connected to the terminal body.

Hereinafter, the detailed construction of a manipulation unit 130 applied to the present invention will be described. For the sake of convenience of explanation, the manipulation unit 130 is referred to as an "input device 200" in the following description.

Figure 3:
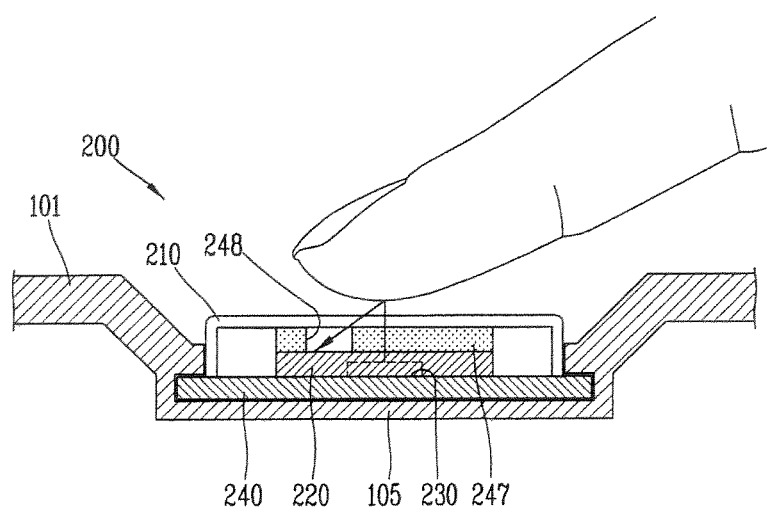
FIG. 3 is a cross-sectional view illustrating an input device according to an embodiment of the present invention.
Figure 4:
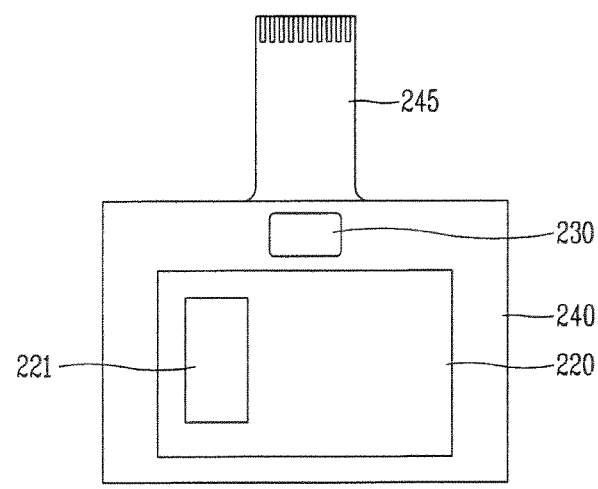
FIG. 4 is a plan view illustrating a printed circuit board illustrated in FIG. 3.

FIG. 3 is a cross-sectional view illustrating an input device 200 according to an embodiment of the present invention. FIG. 4 is a plan view illustrating a printed circuit board illustrated in FIG. 3. Referring to FIGS. 3 and 4, the input device 200 may include a key button 210, an illumination sensor 220, and a light-emitting portion 230.

The key button 210 is formed of a transparent material, which has an internal space for mounting the illumination sensor 220 and the light-emitting portion 230. The transparent material of the key button 210 allows a light signal emitted from the light-emitting portion 230 and external light signals to pass through. Transparency is a concept including full-transparency or semi-transparency, and the key button 210 may be formed of a transparent plastic material, or other similar material.

FIGS. 3 and 4 illustrate that an overall region of the key button 210 is formed of a transparent material. It is also possible that a partial region of the key button 210 is formed of a transparent material and the remaining region is formed of a non-transparent material. The key button 210 may have a structure that is fixed to the front case 101 or to a printed circuit board (PCB) 240.

The illumination sensor 220 is located in an internal space of the key button 210 to sense ambient illumination of the terminal body or key button. The illumination sensor 220 receives a light signal having a particular wavelength bandwidth, such as visible rays, and senses illumination based on the particular wavelength. The illumination sensor 220 may include a light-receiving portion 221 for receiving the light signal.

The light-emitting portion 230 is located in an internal space of the key button 210 and at a side of the illumination sensor 220. The light-emitting portion 230 outputs a light signal for detecting a touch applied to the key button 210. The light signal output by the light-emitting portion 230 has a particular wavelength bandwidth, such as a bandwidth that is different from the wavelength bandwidth for sensing illumination, and is output to the outside through the key button 210.

Examples of the light-emitting portion 230 may include an infrared-emitting module for outputting infrared rays. When a touch is applied to the key button 210, a light signal (infrared rays) output from the light-emitting portion 230 is reflected by the user's finger, and the reflected light signal (infrared rays) is input to the light-receiving portion 221 of the illumination sensor 220. The arrow in FIG. 3 indicates a traveling direction of the light signal output from the light-emitting portion 230.

The light-receiving portion 221 of the illumination sensor 220 receives a light signal having a first bandwidth (visible rays) for sensing illumination. The light receiving portion 221 is configured to receive a light signal having a second bandwidth (infrared rays) for detecting a touch applied to the key button 210.

The illumination sensor 220 and light-emitting portion 230 may be mounted on the PCB 240. The PCB 240 may be formed a rigid substrate. The PCB 240 may be supported by a supporting portion 105 formed on the front case 101 and may be electrically connected to a main board inside the terminal body by a flexible printed circuit board (FPCB) 245.

A spacer 247 with an elastically deformable material may be additionally provided between the illumination sensor 220 and an internal wall of the key button 210. The spacer 247 is provided to suppress shock generated when a touch is applied to the key button 210 from being directly transferred to the illumination sensor 220 and may be formed of a rubber or silicon material. The spacer 247 is formed with a through hole 248 for inputting a light signal to the light-receiving portion 221.

Figure 5:
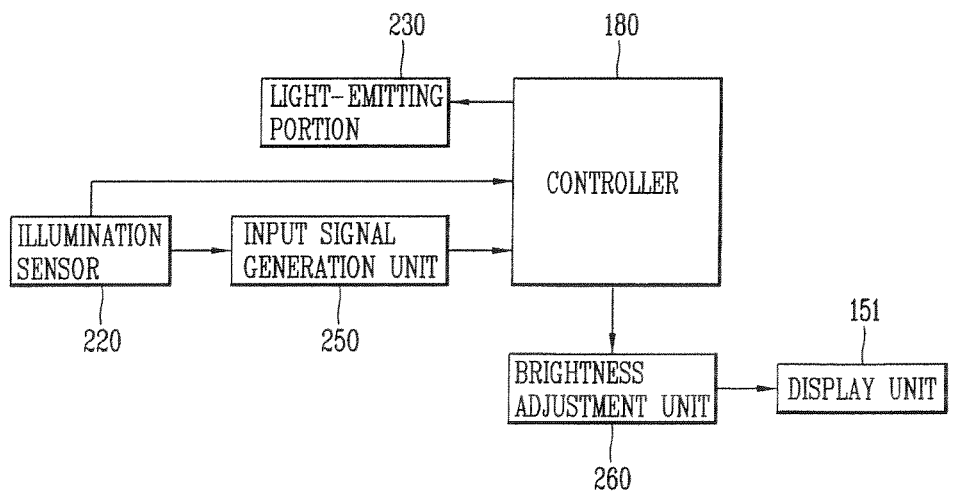
FIG. 5 is a block diagram illustrating a configuration of an input device according to an embodiment of the present invention.

FIG. 5 is a block diagram illustrating a configuration of an input device according to an embodiment of the present invention. Referring to FIG. 5, the illumination sensor 220 is connected to an input signal generation unit 250. The input signal generation unit 250 generates a touch input signal when a light signal (infrared rays) output from the light-emitting portion 230 is input to the light-receiving portion 221 of the illumination sensor 220.

The illumination sensor 220, light-emitting portion 230, and input signal generation unit 250 may be electrically connected to the controller 180 of the mobile terminal 100. It is also possible to have a configuration where the input signal generation unit 250 is included in the controller 180.

The controller 180 controls the operation of the light-emitting portion 230, for example, whether or not the light signal is output. The controller 180 also receives a touch input signal generated from the input signal generation unit 250 and applies a control command to components mounted on the terminal body based on the touch input signal. Moreover, the controller 180 applies a control command to components mounted on the terminal body using illumination sensing data supplied from the illumination sensor 220.

Examples of the mounted components may include a display unit 151. The mobile terminal 100 may further include a brightness adjustment unit 260 for adjusting the brightness of the display unit 151 based on the sensing result of the illumination sensor 220.

The brightness adjustment unit 260 adjusts the brightness of the display unit 151 according to ambient illumination. This is facilitated by adjusting a lighting unit for illuminating the display unit 151 or by adjusting an amount of light emitted by the display unit if the display unit emits light spontaneously.

The brightness adjustment unit 260 adjusts the brightness of the display unit 151 to a higher level as ambient illumination becomes brighter. In other words, the brightness adjustment unit 260 adjusts the brightness of the display unit 151 such that the brightness of the display unit 151 is proportional to ambient illumination.

FIG. 5 illustrates the brightness adjustment unit 260 separated from the controller 180. It is also possible that the brightness adjustment unit 260 is included in the controller 180.

Figure 6:
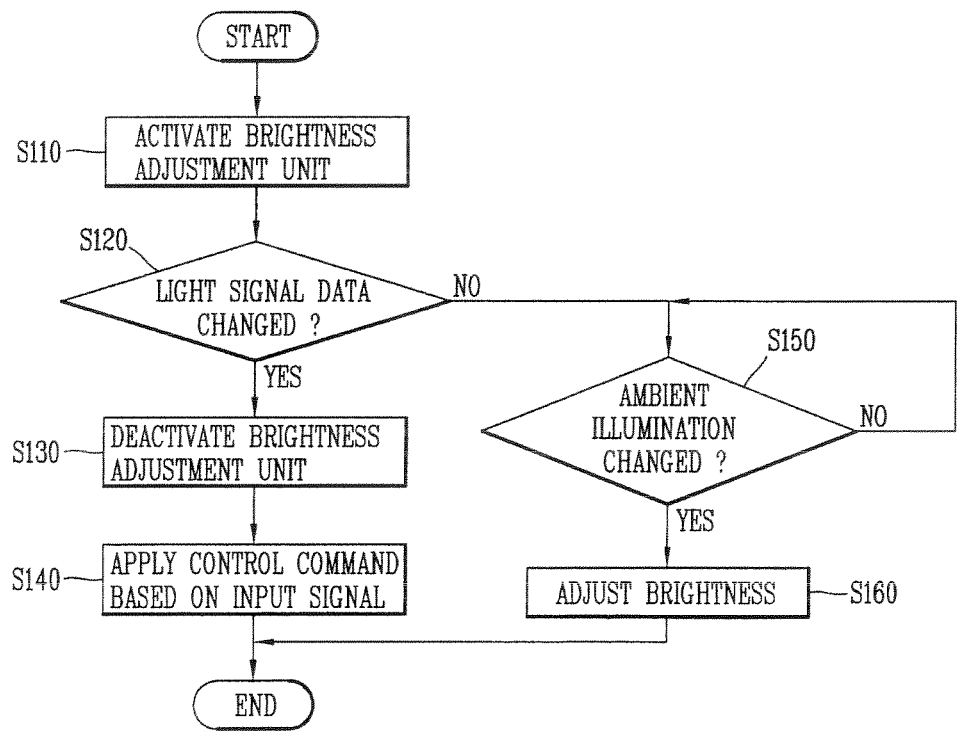
FIG. 6 is a flow chart illustrating a method of a brightness adjustment unit and an input device according to an embodiment of the present invention.

FIG. 6 is a flow chart illustrating a method of a brightness adjustment unit and an input device according to an embodiment of the present invention. The controller 180 activates the brightness adjustment unit 260 (S110). It is possible to set the brightness adjustment unit 260 to maintain an activated state until receiving another control command.

The controller 180 then determines whether an amount of the light signal (infrared) data received by the light-receiving portion 221 of the illumination sensor 220 changes (S120).

Then, the controller 180 controls activation or deactivation of the brightness adjustment unit 260 based on the determination.

A determination that the amount of the light signal (infrared) data changes or a light signal is received by the light-receiving portion 221 means that a touch is applied to the key button 210 and a light signal (infrared rays) is received by the light-receiving portion. If it is determined that the amount of the light signal (infrared) data changes, the controller 180 deactivates the brightness adjustment unit 260 (S130), thereby making it possible to prevent the brightness of the display unit 151 from being adjusted by an illumination change caused by the user's finger covering the key button 210. When the brightness adjustment unit 260 is deactivated, the controller 180 applies a control command to mounted components based on an input signal generated from the input signal generation unit 250 (S140).

On the other hand, if it is determined that the amount of the light signal (infrared) data does not change or if there is no input of a light signal, the brightness adjustment unit 260 continues to perform its operation. In other words, the brightness adjustment unit 260 determines a change of ambient illumination (S150) and adjusts the brightness of the display unit 151 on the basis of the determination (S160).

The present invention allows the illumination sensor 220 to be provided inside the key button 210 and, therefore, it is not required that a separate mounting space be provided for mounting the illumination sensor on the terminal body. Accordingly, it may be possible to enhance the spatial utility of the mobile terminal 100 and provide a new touch input structure using the illumination sensor 220 applied to the input device 200.

Figure 7:
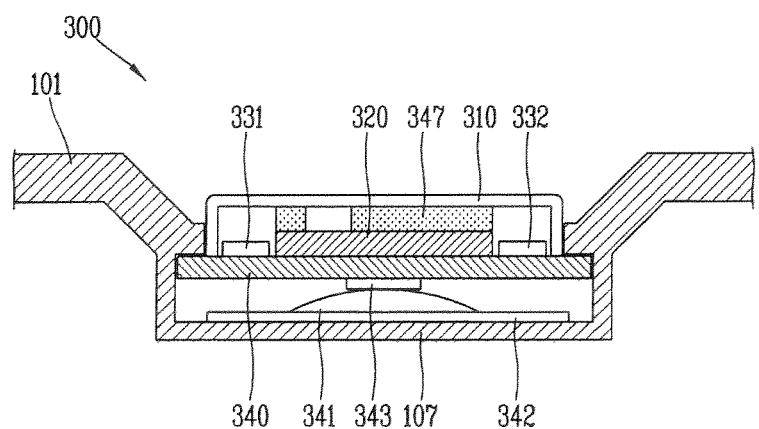
FIG. 7 is a cross-sectional view illustrating an input device according to another embodiment of the present invention.
Figure 8:
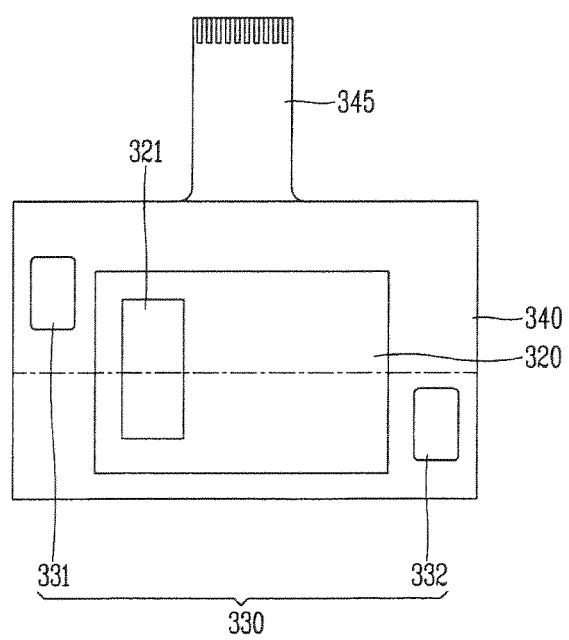
FIG. 8 is a plan view illustrating a printed circuit board illustrated in FIG. 7.

FIG. 7 is a cross-sectional view illustrating an input device according to another embodiment of the present invention and FIG. 8 is a plan view illustrating a printed circuit board illustrated in FIG. 7. In FIGS. 7 and 8, the same construction as in the previous embodiment is designated by the same reference numerals and their description will be replaced by the previous description.

As in the previous embodiment, an input device 300 may include a key button 310, an illumination sensor 320, and a light-emitting portion 330. The illumination sensor 320 is connected to an input signal generation unit 250 and the illumination sensor, light-emitting portion 330, and input signal generation unit are connected to the controller 180.

The input device 300 may further include a dome switch 341 in addition to the other elements. The embodiment illustrated in FIGS. 7 and 8 is of a key button 310 that is fixed to a printed circuit board 340 such that it can be moved in an inward direction of the terminal body.

The dome switch 341 is formed on a dome sheet 342 in order to generate an input signal according to pressing the key button 310. The dome sheet 342 is supported by a supporting portion 107 formed on the front case 101.

The printed circuit board 340 is formed with a push protrusion 343, which presses the dome switch 341 in response to pressing the key button 310. Accordingly, the dome switch 341 is deformed to be connected to a contact point of the dome sheet 342, thereby generating a push input signal.

The input device 300 of the embodiment illustrated in FIGS. 7 and 8 allows an input method mixed with a method of touching the key button 310 and a method of clicking the illumination sensor 320 to be applied. The controller 180 applies a control command to components mounted on the terminal body based on a touch input signal generated by the input signal generation unit 250 and a push input signal generated by the dome sheet 342.

The embodiment illustrated in FIGS. 7 and 8 further includes a first light-emitting portion 331 and a second light-emitting portion 332 as part of light-emitting portion 330. The first and second light-emitting portions 331, 332 may be mounted on both sides of the illumination sensor 320. The first and second light-emitting portions 331, 332 are provided to allow the input device 300 to detect a slide touch applied to the key button 310 in at least one direction. The slide touch is an input by sliding the user's finger while in contact with the key button 310.

The first light-emitting portion 331 and second light-emitting portion 332 may be located at asymmetric positions with respect to the center of the light-receiving portion 321 in order to differentiate an amount of the light signal (infrared rays) data input to the light-receiving portion 321 according to a starting point of the user's finger at the time of the slide touch. For example, the slide touch can be differentiated between starting from the right region of the key button 310 and traveling toward the left region and starting from the left region of the key button and traveling toward the right region.

The input signal generation unit 250 generates a touch input signal based on a changed amount of the light signal (infrared rays) data received at the light-receiving portion 321. The input signal generation unit 250 also generates a different touch input signal according to a direction of the slide touch based on the starting point of the slide touch.

The embodiment illustrated in FIGS. 7 and 8 has a dome switch 341 added to the previous embodiment as well as the light-emitting portion 330 implemented with first and second light-emitting portions 331, 332. However, an input device of the present invention may have all the elements added or some of the elements may be selectively applied.

FIGS. 9A through 9E are views illustrating examples of an input method using the input device illustrated in FIG. 7. Using the input device 300 illustrated in FIGS. 7 and 8, a variety of input methods can be implemented by using a touch input and a push input. It is possible to set the controller 180 to generate a different control command according to a duration time of the push input and touch input or a direction of the slide touch.

Figure 9A:
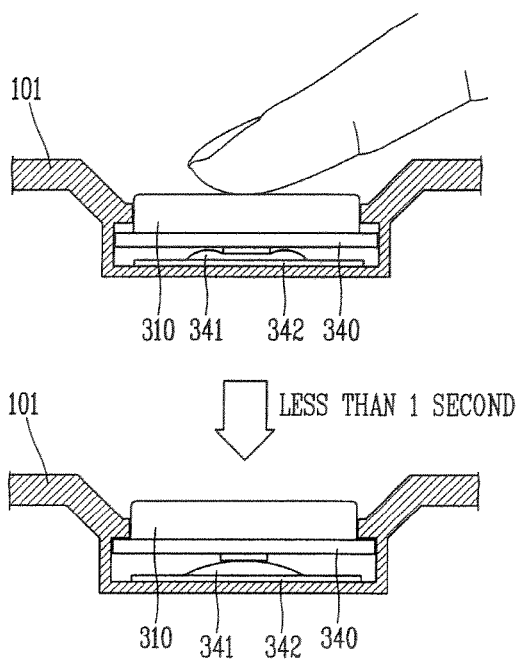
FIGS. 9A through 9E are views illustrating examples of an input method using the input device illustrated in FIG. 7.
Figure 9B:
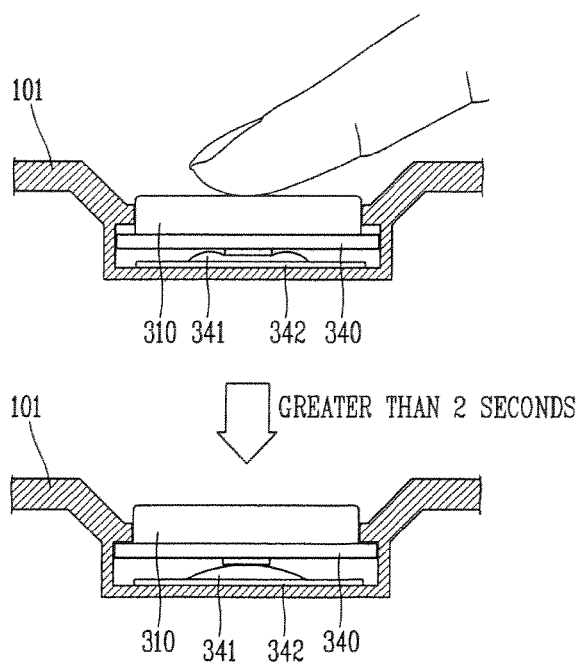

FIGS. 9A and 9B illustrate a push input method using a dome switch 341. As illustrated in FIGS. 9A and 9B, the push input can be classified into two types of input methods according to the duration time.

A duration time of the push input that is set within a predetermined period of time, such as 1 second as illustrated in FIG. 9A, may be differentiated from a duration time of the push input that is set above a predetermined period of time, such as 2 seconds as illustrated in FIG. 9B. The situation illustrated in FIG. 9A is designated as a short click and the situation illustrated in FIG. 9B is designated as a long click.

Figure 9C:
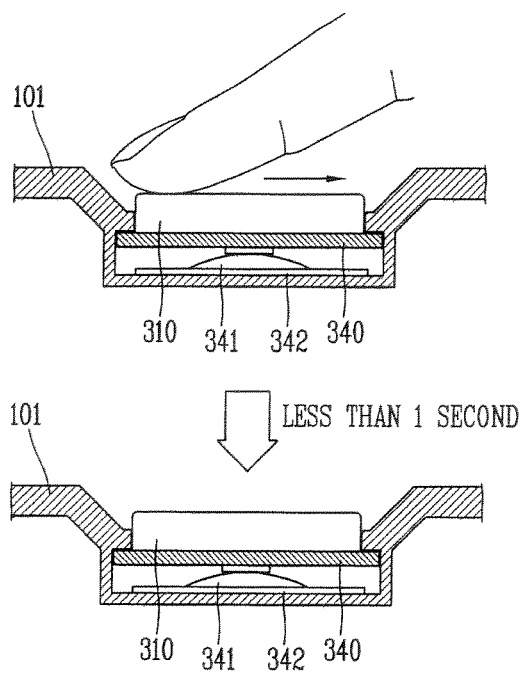
Figure 9D:
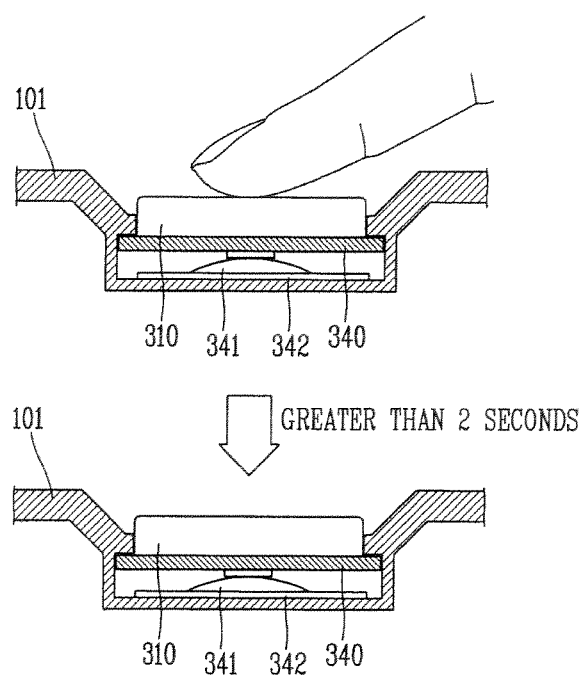

FIGS. 9C and 9D illustrate an input method through a touch input. Two types of input methods are illustrated according to a duration time of the touch input. The touch input may be classified into a slide touch, as illustrated in FIG. 9C, and a long touch, as illustrated in FIG. 9D. The input signal generation unit 250 generates a different input signal according to a duration time of the touch input, specifically, a duration time of the light signal (infrared) data.

FIG. 9C illustrates a slide touch made within a predetermined period of time, such as 1 second. FIG. 9C, illustrates that the slide touch is made from the right region of the key button 310 toward the left region of the key button, or vice-versa. FIG. 9D illustrates a touch input applied for longer than a predetermined period of time, such as 2 seconds.

Figure 9E:
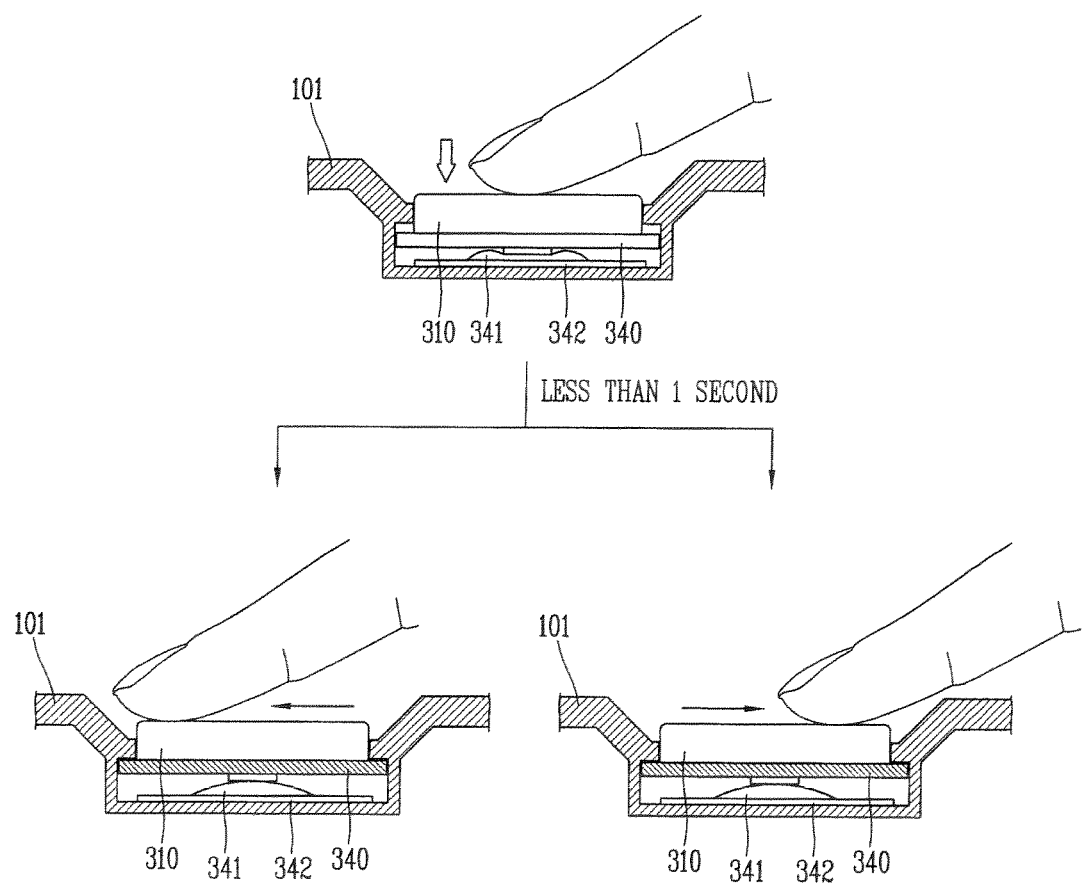

On the other hand, it is possible to have an input method in which a push input and a touch input are sequentially made, as illustrated in FIG. 9E. When at least the push input or touch input is made and then the other input is made within a predetermined period of time, such as 1 second, the controller 180 can process the input as a separate input from the push input and touch input. FIG. 9E illustrates a method of sequentially inputting a short click and a slide touch, an input method referred to as a "click-slide touch." A sequential push-and-touch input or sequential touch-and-push input may be modified in a various forms in addition to the click-slide touch illustrated in FIG. 9F.

As previously described, a method of inputting via an input device may include five types of input methods, such as a short click, a long click, a slide touch, a long touch, and a click-slide touch. The controller 180 may apply a different control command for each of the touch inputs (slide touch or long touch), the push inputs (short click or long click), and the sequential push-and-touch input (click-slide touch).

A method of operating an input device associated with input signal generation will be described with reference to FIG. 10. FIG. 10 is a flow chart illustrating a method of generating an input signal in a mobile terminal 100 according to the present invention.

As illustrated in FIG. 10, the controller 180 sequentially determines an existence or non-existence of a push input, a changed amount of infrared data, and a changed amount of visible rays data. The controller 180 determines the existence or non-existence of the input (push input) via a dome switch 341 (S210).

When it is determined that there is a push input, the controller 180 determines a duration time of the push input (S220). If the duration time of the push input is greater than a predetermined period of time, such as 1 second, the controller 180 determines that a long click has been received. If the duration time of the push input is less than a predetermined period of time, such as 1 second, the controller 180 or input signal generation unit 250 determines a changed amount of the light signal (infrared) data input to a light-receiving portion 321 of the illumination sensor 320 (S230).

If there is no change in the amount of infrared data, the controller 180 determines that a short click has been received. If there is a change in the amount of infrared data, the controller 180 determines that a click-slide touch has been received.

If it is determined that there is no push input via the dome switch 341, the controller 180 or input signal generation unit 250 determines a changed amount of the light signal (infrared) data input to a light-receiving portion 321 of the illumination sensor 320 (S240).

If there is a change in the amount of infrared data, the controller 180 or input signal generation unit 250 determines a duration of the infrared data (S250). If the duration of the infrared data is less than a predetermined period of time, such as 1 second, the controller 180 or input signal generation unit 250 determinates that a slide touch has been received. If the duration of the infrared data is greater than a predetermined period of time, such as 2 seconds, the controller 180 or input signal generation unit 250 determinates that a long touch has been received.

If there no push input and there is no change in the amount of infrared data, the controller 180 determines the illumination sensing data of the illumination sensor 220 (S260). If there is a change in the illumination sensing data, the controller 180 allows the brightness adjustment unit 260 to adjust the brightness of the display unit 151 according to the change. The adjustment of the brightness of the display unit 151 replaces the process of activating or deactivating the brightness adjustment unit 260 according the previous description.

The operation of a mobile terminal 100 may be controlled in a variety of operation modes using an input device having various input methods. For example, the controller 180 can apply a control command to the display unit 151 in order to control the screen display of the display unit according to the previously described push input and touch input. The control command may include at least a command for restoring a preset screen during the execution of a specific mode, a command for executing a selected operation, a command for displaying upper-level items of the currently-executed function, a command for displaying a menu, a command for switching to a next or previous page, a command for moving a cursor or pointer, a command for scrolling a screen in a specific direction, or a zoom-in or zoom-out command.

Examples of a method of controlling a mobile terminal 100 using an input device will be described with reference to FIGS. 11 to 13. FIGS. 11A through 11C are views illustrating examples of an input method via an input device in a text view mode according to the present invention.

Figure 11A:
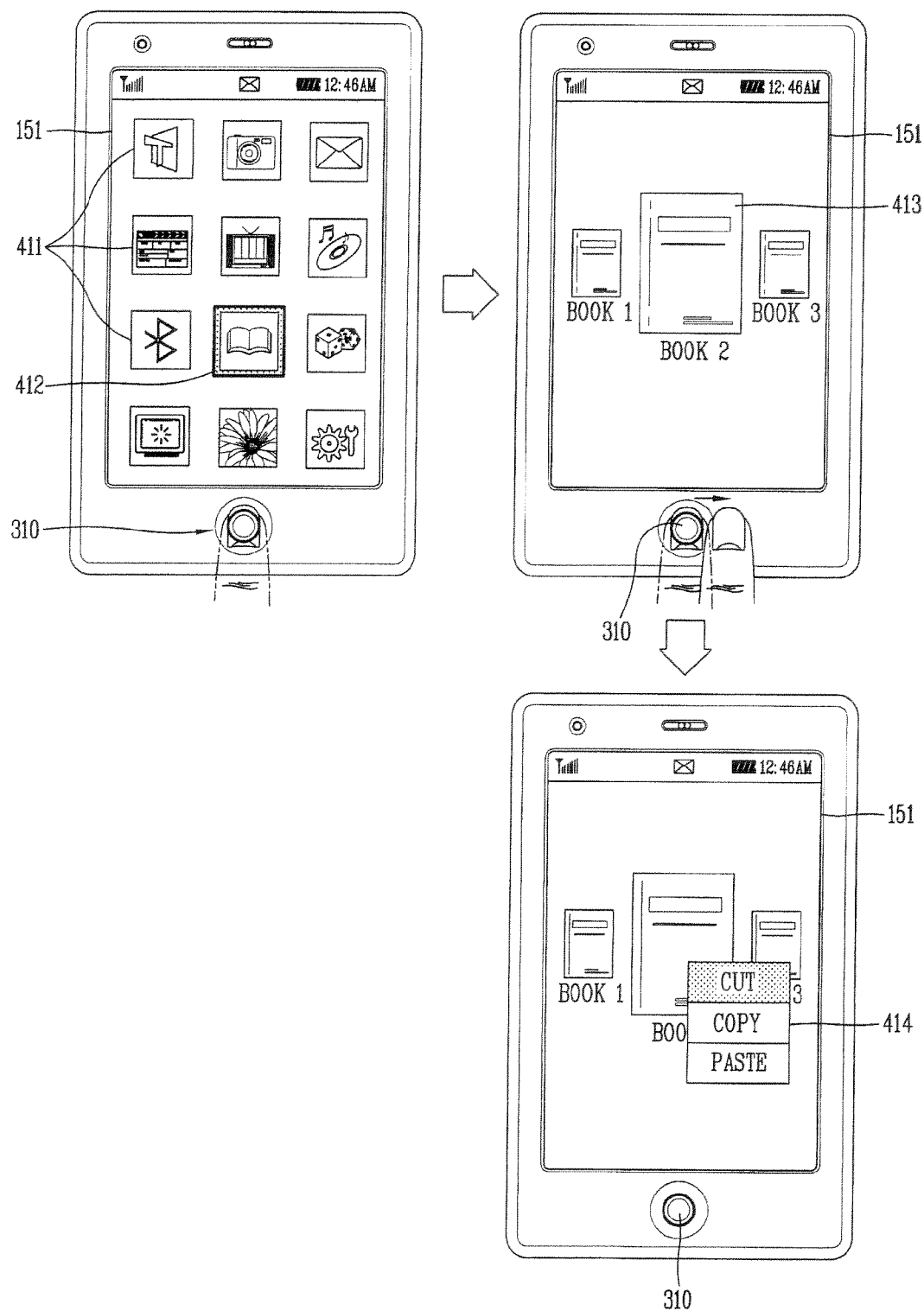
FIGS. 11A through 11C are views illustrating examples of an input method via an input device in a text view mode according to the present invention.

As illustrated in FIG. 11A, a plurality of icons 411 are displayed on the display unit 151. The icons 411 indicate various operation modes and applications provided by a mobile terminal 100. The user selects one of those icons 411 to implement an operation mode or application.

If display unit 151 is a touch screen, one of the icons 411 can be selected by directly touching it. It is also possible to select one of the icons 411 using the input device 300.

A pointer 412 may be displayed on one of the icons 411 and the pointer 412 may be moved by using an input device 300. For example, the pointer 412 may be moved in a desired direction by applying a slide touch in the left or right direction to the key button 310.

If the pointer 412 is placed at a desired position and then a short click is applied to the key button 310, an operation mode or application corresponding to the corresponding icon will be implemented. As illustrated in FIG. 11A, a text view mode is implemented and a short click functions as an "Enter key."

If a text view mode is implemented, text files 413 stored in the mobile terminal 100 can be displayed as icons on the display unit 151. FIG. 11A illustrates a slide touch applied to the key button 310 in the left or right direction in order to move the displayed text files 413 in the desired direction, where a text file displayed in the center is a currently selected file. A pointer may also be displayed on any one of the text files 413 to indicate a currently selected file.

As illustrated in FIG. 11A, a click-right slide touch is applied to display a menu 414 for the selected text file 413. Commands such as cut, copy and paste for editing the text file 413 may be displayed on the menu 414. The pointer displayed on the commands may be moved by a slide touch and the selected command may be implemented by a short click. When a click-left slide touch is applied to the key button 310 when the menu 414 is displayed, the display of the menu 414 may be deactivated. In other words, the click-slide touch may be used as a menu display command or menu display release command according to a direction of the slide touch.

Figure 11B:
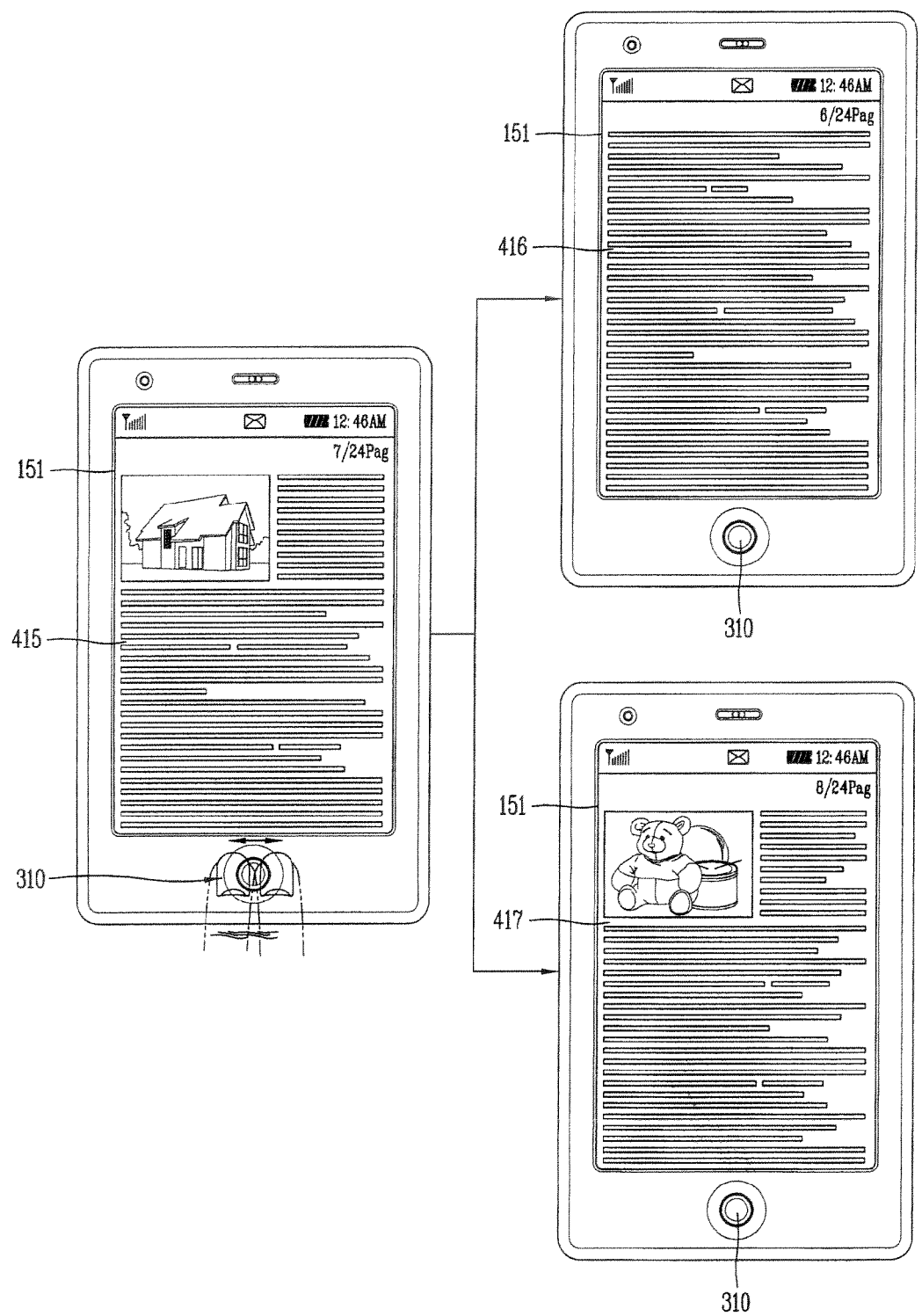

FIG. 11B illustrates that any one of the text files 413 may be selected and implemented. The contents of the selected file are displayed as text. When the display unit 151 displays a particular page, the displayed page may be switched by applying a slide touch to the key button 310. For example, a next page 416 is displayed on the display unit 151 when a left-directional slide touch is applied and a previous page 417 is displayed on the display unit when a right-directional slide touch is applied.

Figure 11C:
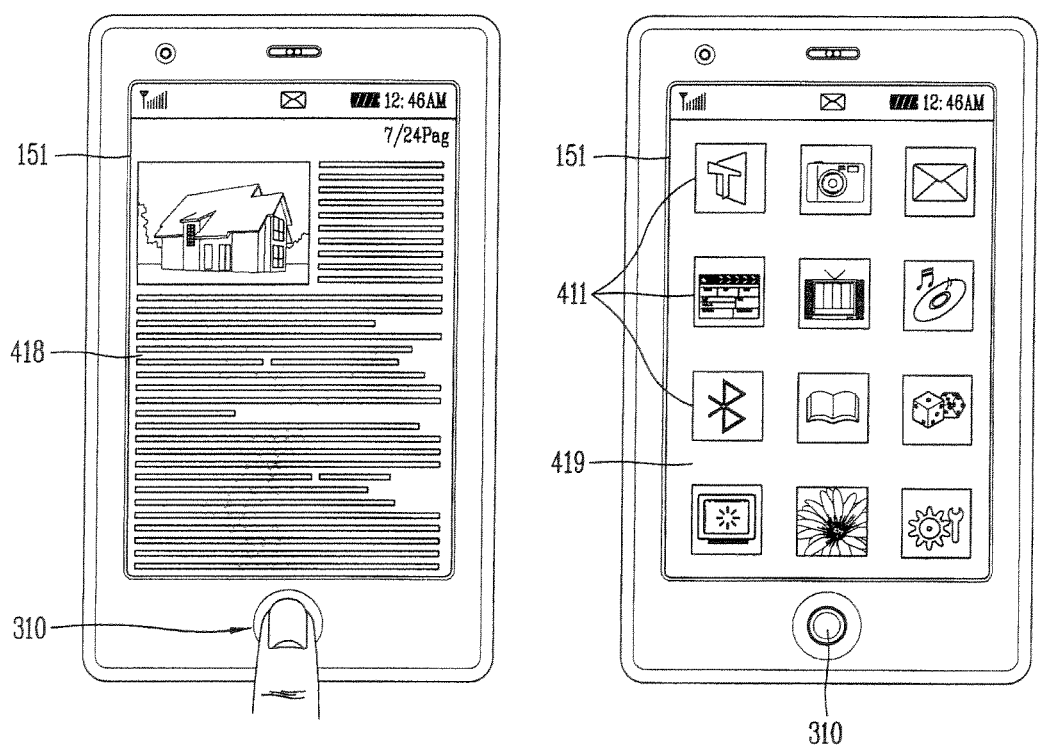

FIG. 11C illustrates a process of restoring an execution screen of the operation mode to a predetermined screen using an input device. As illustrated in FIG. 11C, an execution screen 418 in a text view mode can be restored to a menu view screen 419 on which icons 411 are displayed by applying a long click to the key button 310.

FIGS. 12A through 12E illustrate an input method through an input device in an image view mode.

Figure 12A:
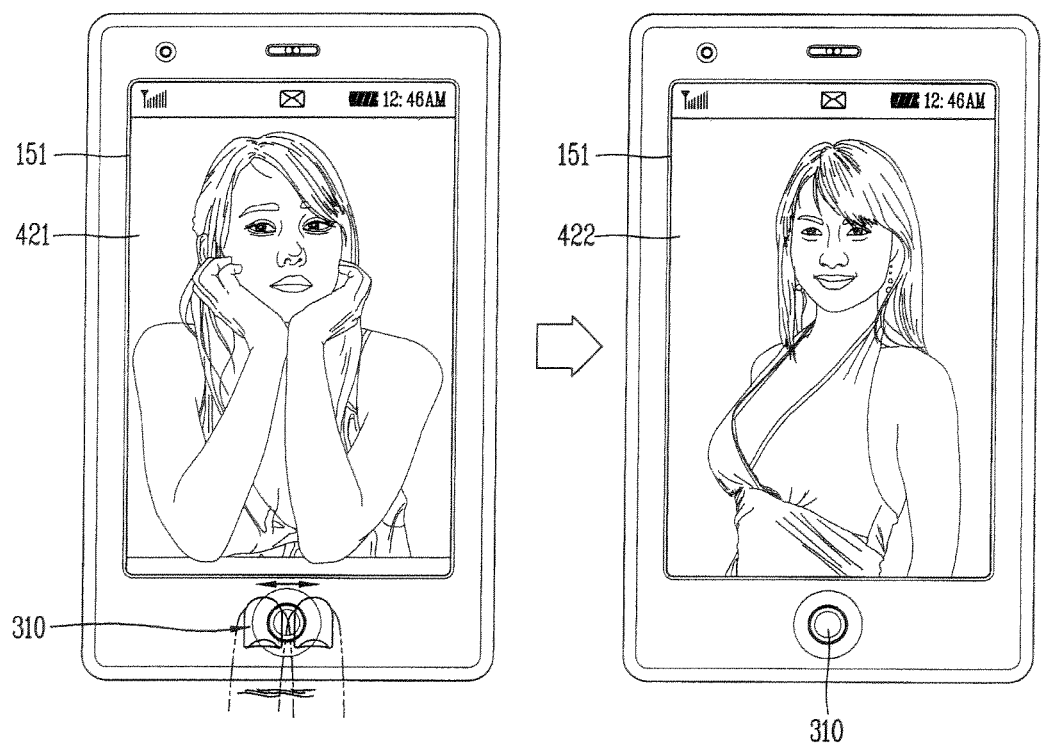

FIG. 12A illustrates a screen on which an image photo view mode is implemented. Any one image 421 of images stored in a mobile terminal 100 is displayed on the display unit 151. A next or previous image 422 may be displayed by applying a slide touch to the key button 310.

FIG. 12B illustrates a process of zooming an image in or out using the input device. If a long touch is applied to the key button 310 while executing an image view mode, icons 423, 424 for selecting a zoom in/out mode or screen scroll mode are displayed. The zoom in/out mode or screen scroll mode is selected by applying a short click to the key button 310. A pointer for displaying a currently selected mode may be displayed on either of the icons 423, 424.

FIG. 12B illustrates a zoom in/out mode by which a screen can be enlarged or reduced by applying a slide touch to the key button 310. For example, an enlarged screen 426 is displayed when a slide touch is applied in the right direction. The screen can also be reduced when a slide touch is applied in the left direction.

Figure 12C:
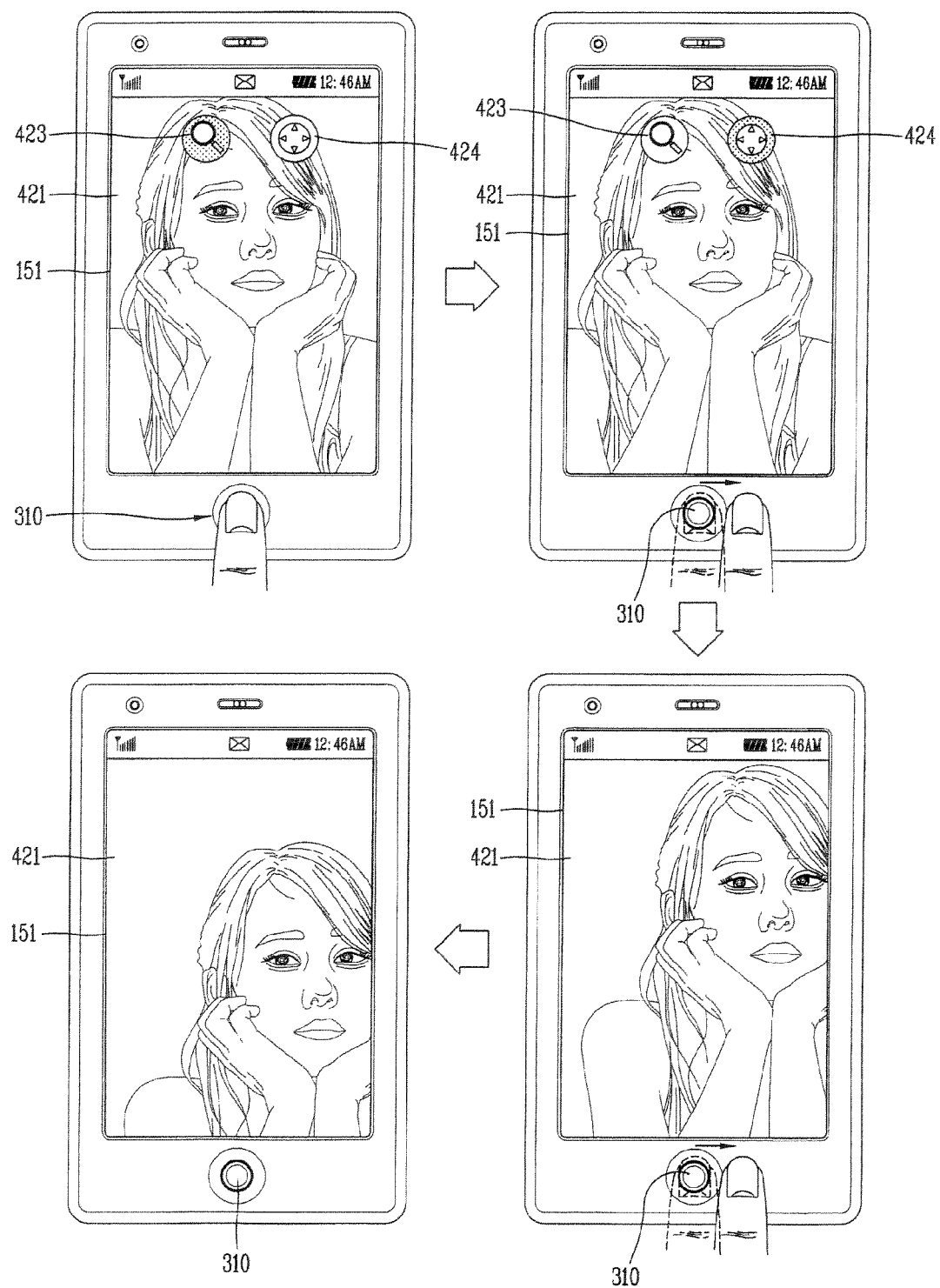

FIG. 12C illustrates a process of scrolling a screen in a screen scroll mode. The zoom in/out mode can be switched to the screen scroll mode by applying a short click to the key button 310. For example, a pointer displayed on the icon 423 displaying a zoom in/out mode is moved to the icon 424 displaying a screen scroll mode in order to switch to the screen scroll mode. A long touch is applied to the key button 310 to release the zoom-in/out mode or screen scroll mode.

The displayed screen can be scrolled in a left or right direction by applying a slide touch to the key button 310. For example, when a slide touch is applied toward the right direction, as illustrated in FIG. 12C, the displayed screen is moved to the right.

The displayed screen can be scrolled in an upward or downward direction by applying a click-slide touch to the key button 310. For example, when the key button 310 is clicked and a slide touch is applied in the right direction, as illustrated in FIG. 12C, the displayed screen is moved in a downward direction.

Figure 12D:
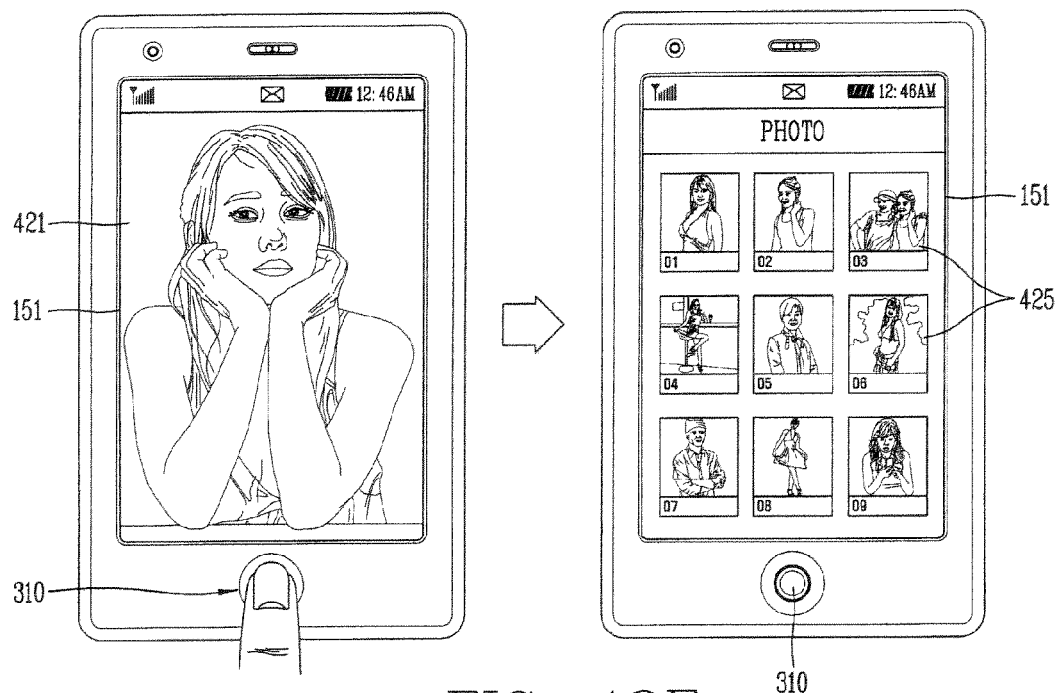

FIG. 12D illustrates a process of switching from an image view mode to an upper-level of a currently displayed image. As illustrated in FIG. 12D, if a short click is applied to the key button 310, an upper-level of the currently displayed image will be displayed. As a result, all the items 425 in a folder in which the currently displayed image is stored will be displayed.

Figure 12E:
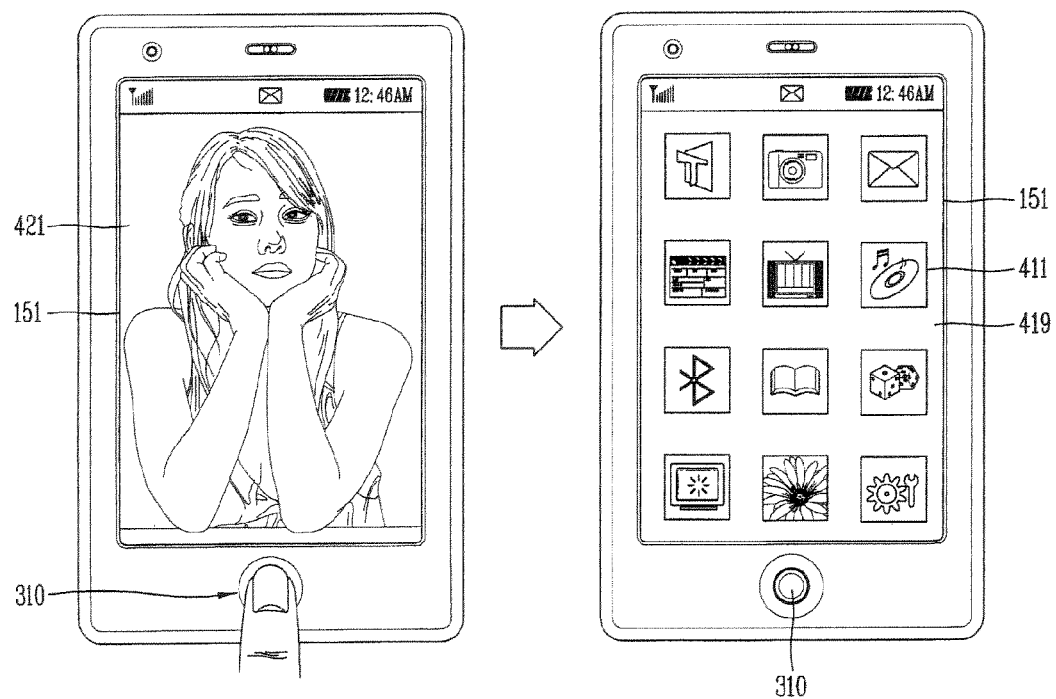

FIG. 12E illustrates a process of restoring an execution screen in an image view mode to a predetermined screen. For example, if a long click is applied to the key button 310, an execution screen is restored to a menu display screen on which icons 411 are displayed. The long click functions as a "Home key."

Figure 13A:
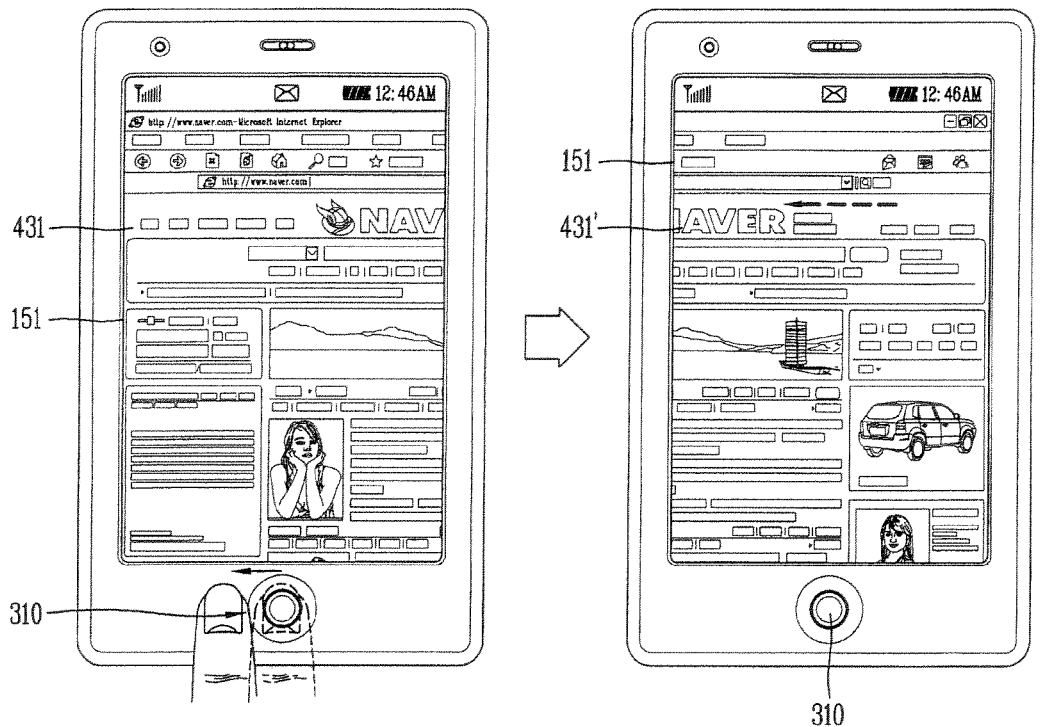
FIGS. 13A and 13B are views illustrating examples of an input method via an input device in a web-browsing mode according to the present invention.
Figure 13B:
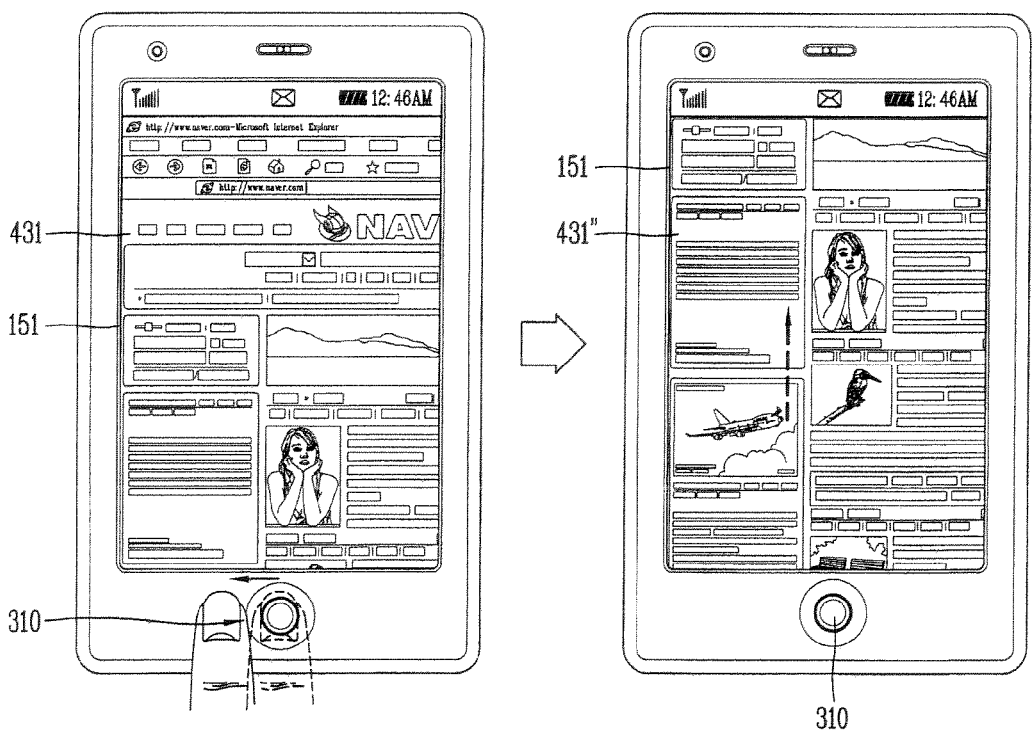

FIGS. 13A and 13B are views illustrating examples of an input method via an input device in a web-browsing mode. The input methods illustrated in FIGS. 12B through 12E for scaling or scrolling a screen may be applicable to a web browsing mode in a similar manner.

As illustrated in FIG. 13A, a web browsing screen 431 is displayed on the display unit 151 in a web browsing mode. The web browsing screen can be scrolled in a left or right direction by applying a slide touch to the key button 310. For example, when a slide touch is applied to the key button 310 in the left direction, the web browsing screen is moved to the left direction and regions that have not been previously displayed will be displayed.

As illustrated in FIG. 13B, the displayed screen can be scrolled in an upward or downward direction by applying a click-slide touch to the key button 310. For example, when the key button 310 is clicked and a slide touch is applied in the left direction, as illustrated in FIG. 13B, the displayed screen is moved in an upward direction.

Figure 14:
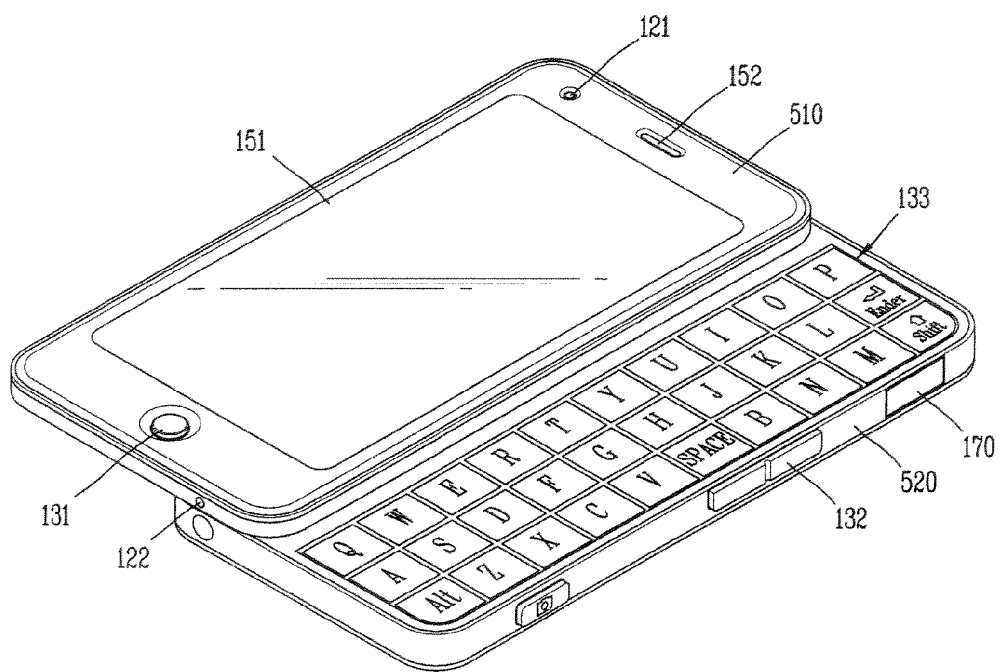
FIG. 14 is a perspective view illustrating a mobile terminal according to another embodiment of the present invention.

FIG. 14 is a perspective view illustrating a mobile terminal 100 according to another embodiment of the present invention. The mobile terminal 100 may include first and second bodies 510, 520 combined with each other in a relatively movable manner. A slide type terminal is illustrated in which the first body 510 is slidably combined with the second body 520. However, the mobile terminal 100 may also have a different form, such as folder type or swing type.

A display unit 151, a camera 121, a speaker 152, a first manipulation unit 131, and a microphone 122 may be located on the first body 510. The previously described input devices 200, 300 may be applied to the first manipulation unit 131. Second and third manipulation units 132, 133, and an interface unit 170 may be located on the second body 520.

The second body 520 may be moved from a closed configuration, in which a portion of the second body is hidden, to an open configuration, in which the hidden portion is exposed. A third manipulation unit 133 is mounted on the portion exposed by the movement. The third manipulation unit 133 may include key buttons having a QWERTY-type arrangement and key information, such as characters, numerals, and symbols for inputting keys is displayed on the key buttons. The previously described input devices 200, 300 may be applicable to portion of the key buttons or all the key buttons.

An example will be described on the assumption that a structure of the input device 300 illustrated in FIG. 7 is applied to the third manipulation unit 133. FIGS. 15 and 16 are views illustrating an operation method of the mobile terminal 100 illustrated in FIG. 14.

Key buttons of the third manipulation unit 133 are arranged to form at least one column on the second body 520. FIGS. 15 and 16 illustrate an example in which a structure of the previously described input device 300 is only applied to key buttons 133' placed at the most upper column of a plurality of the columns.

A process is illustrated in which text is deleted in a text editing mode using a slide touch applied to the key buttons 133'. In other words, the slide touch may be assigned to a text delete command in the text editing mode.

As illustrated in FIGS. 15 and 16, a text editing screen for transmitting a text message or e-mail is displayed on the display unit 151. Text can be entered via a push input to the third manipulation unit 133. Entered text is displayed on the display unit 151.

As illustrated in FIG. 15, if a left-directional slide touch is applied to a key, such as "P", placed at a right end portion of the key buttons 133' arranged on the upper end, text placed on the left side of the current cursor is deleted. As illustrated in FIG. 16, if a left-directional slide touch is applied to a predetermined number of keys from the key, such as "P", placed at a right end portion of the key buttons 133', text can be deleted according to the number of text characters corresponding to the number of the slide-touched key buttons. As illustrated, four text characters are deleted when a slide touch is applied to four key buttons.

Figure 17:
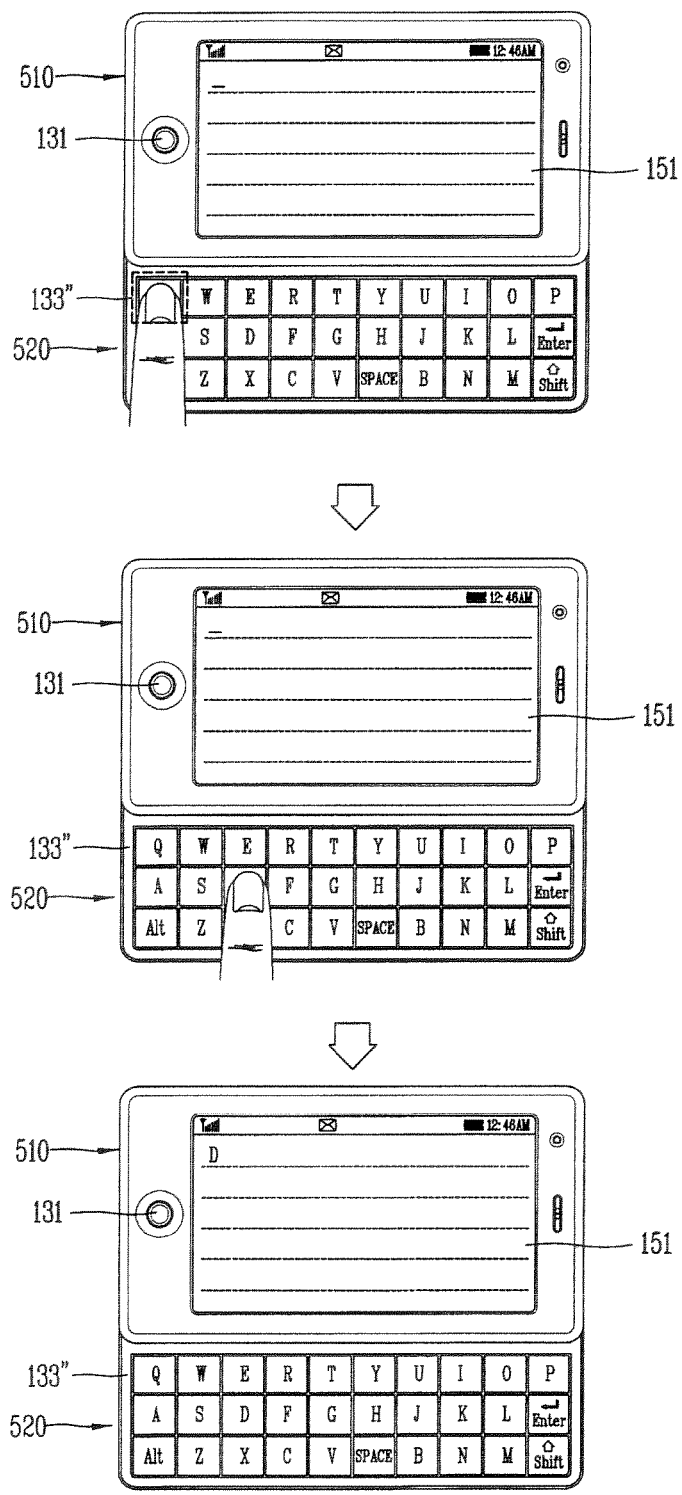
FIG. 17 is a view illustrating another operation method of the mobile terminal illustrated in FIG. 14.

FIG. 17 is a view illustrating another operation method of the mobile terminal 100 illustrated in FIG. 14. FIG. 17 illustrates an upper/lower-case character conversion method using an input device.

A plurality of key information may be assigned to at least one of the key buttons of the third manipulation unit 133. For example, key information (Shift) for upper/lower-case character conversion as well as key information (Q) for character input may be assigned to a particular key button 133" (Q-button) of the key buttons of the third manipulation unit 133. It is possible that key information (Q) for character input is entered if a short click is applied to the relevant key button 133" and key information (Shift) for upper/lower-case character conversion is entered if a long touch is applied thereto.

As illustrated in FIG. 17, when the user desires to enter an upper case character "D", a long touch is applied to the Q-button 133" and a short click is applied to a D-button. The upper case character "D" is then entered.

Figure 18A:
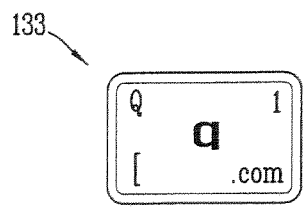
FIGS. 18A through 18C are views illustrating still another operation method of the mobile terminal illustrated in FIG. 14.
Figure 18B:
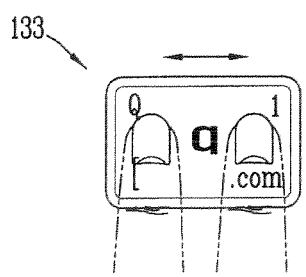
Figure 18C:
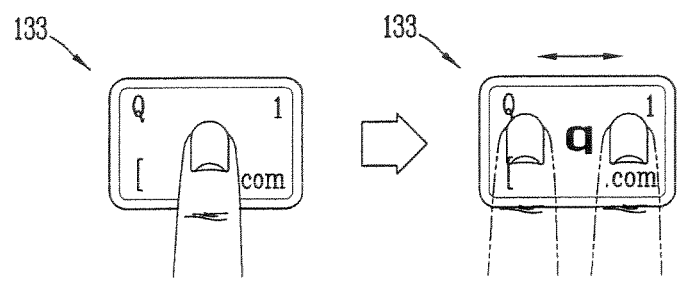

FIGS. 18A through 18C are views illustrating still another operation method of the mobile terminal 100 illustrated in FIG. 14. A plurality of key information may be displayed on each of the key buttons of the third manipulation unit 133. The key information may include different types of information, such as characters, numerals, symbols, and words. A plurality of key information are displayed on the key button and at least two of a touch input, push input, and sequential push-and-touch input to those key buttons may be assigned to a plurality of key information displayed on the key button.

FIGS. 18A through 18C illustrate that five types of key information are displayed on a single key button. Key information (q) corresponding to a lower-case character is displayed at the center of the key button and key information (Q) corresponding to an upper-case character is displayed at the top-left side of the key button. In addition, key information (1) corresponding to a numeral is displayed at the top-right side of the key button. Furthermore, key information ([) corresponding to symbol is displayed at the bottom-left side of the key button and key information (.com) corresponding to a frequently used word or phrase is displayed at the bottom-right side of the key button.

As illustrated in FIG. 18A, a push input to the key button may be assigned to the key information (q) corresponding to a lower-case character. As illustrated in FIG. 18B, a slide touch to the key button may be assigned to key information (Q, 1) displayed on a top portion of the key button. For example, key information (Q) corresponding to an upper-case character is entered if a left-directional slide touch is applied to the key button and the key information (1) corresponding to a numeral is entered if a right-directional slide touch is applied to the key button.

As illustrated in FIG. 18C, a click-slide touch may be assigned to key information ([ and .com) displayed on a bottom portion of the key button. For example, key information ([) corresponding to a symbol is entered if the key button is clicked and a left-directional slide touch is applied to the key button, and key information (.com) corresponding to a word or phrase is entered if the key button is clicked and a right-directional slide touch is applied to the key button.

According to a structure and an input method of the input device, the number of key buttons can be reduced. This has an advantage of reducing a space of the terminal body on which the input device is mounted.

According to the present invention having the described construction, an illumination sensor is provided inside a key button and it is not necessary to provide a separate mounting space for mounting the illumination sensor on the terminal body. As a result, it is possible to enhance the spatial utility of a mobile terminal and provide a new touch input structure using the illumination sensor applied to the input device.

Furthermore, according to the present invention, a dome switch is additionally applied to an input device to provide an input device capable of receiving both a touch input and a push input. Moreover, touch and push input methods can be mixed with each other, thereby providing various input methods with a fewer number of key buttons.

The configurations and methods of the embodiments described herein are not limited to the terminal described herein. All or part of each embodiment may be selectively combined and configured to make various modifications.

Depending on implementation, it is possible that the present invention can take the form of an entirely hardware embodiment, an entirely software embodiment or an embodiment containing both hardware and software elements. A software embodiment may include, but not be limited to, to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Other components may be coupled to the system. Input/output or I/O devices (including but not limited to keyboards, displays, pointing devices, etc.) can be coupled to the system either directly or through intervening I/O controllers. Network adapters (e.g., modem, cable modem, Ethernet cards) may also be coupled to the system to enable the data processing system to become coupled to other data processing systems or remote printers or storage devices through intervening private or public networks.

It should be understood that the logic code, programs, modules, processes, methods, and the order in which the respective elements of each method are performed are purely exemplary. Depending on the implementation, they may be performed in any order or in parallel, unless indicated otherwise in the present disclosure. Further, the logic code is not related, or limited to any particular programming language, and may be comprise one or more modules that execute on one or more processors in a distributed, non-distributed, or multiprocessing environment.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multi-chip package (such as a ceramic carrier that has either or both surface interconnections of buried interconnections).

In any case, the chip is then integrated with other chips, discrete circuit elements, and/or other signal processing devices as part of either (a) an intermediate product, such as a motherboard, or (b) and end product. The end product can be any product that includes integrated circuit chips, ranging from toys and other low-end applications to advanced computer products having a display, a keyboard or other input device, and a central processor.

Therefore, it should be understood that the invention can be practiced with modification and alteration within the spirit and scope of the appended claims. The description is not intended to be exhaustive or to limit the invention to the precise form disclosed. These and various other adaptations and combinations of the embodiments disclosed are within the scope of the invention and are further defined by the claims and their full scope of equivalents.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims. Therefore, all changes and modifications that fall within the metes and bounds of the claims, or equivalence of such metes and bounds are intended to be embraced by the appended claims.

The foregoing embodiments and advantages are merely exemplary and are not to be construed as limiting the present invention. The present teaching can be readily applied to other types of apparatuses.

The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures.

What is claimed is:

1. A mobile terminal, comprising:
    a terminal body;
    a controller; and
    an input device mounted on the terminal body, wherein the input device comprises:
        at least one key button formed of a transparent material and having an internal space;
        an illumination sensor located in the internal space and having a light-receiving portion, wherein the illumination sensor is configured to sense a first light and a second light, wherein the first light is ambient light;
        a light-emitting portion located at a side of the illumination sensor and configured to output the second light to the outside of the at least one key button for detecting a touch applied to the at least one key button;
        a spacer comprising an elastically deformable material that is positioned between the illumination sensor and an internal wall of the at least one key button such that the spacer is located below the internal wall of the at least one key button, the spacer configured to cover the illumination sensor in order to suppress shock transferred to the illumination sensor when a contact touch is received via the at least one key button, the spacer including a through hole positioned over the light-receiving portion to transfer light to the light-receiving portion, and
        an input signal generation unit configured to generate a touch input signal according to light sensed at the light-receiving portion via the through hole,
    wherein the controller is configured to generate a first control command when the light sensed at the light-receiving portion of the illumination sensor is the first light and generate a second control command when the light sensed at the light-receiving portion of the illumination sensor is the second light.

2. The mobile terminal of claim 1, wherein the light-emitting portion is an infrared-emitting module configured to emit infrared rays.

3. The mobile terminal of claim 1, wherein the light-emitting portion comprises a first light-emitting portion mounted at a first side of the illumination sensor and a second light-emitting portion mounted at a second side of the illumination sensor to detect a slide touch applied to the at least one key button.

4. The mobile terminal of claim 3, wherein the input signal generation unit generates a different touch input signal according to a direction of the slide touch.

5. The mobile terminal of claim 1, further comprising:
    a display unit mounted on the terminal body and configured to display visual information; and
    a brightness adjustment unit configured to adjust a brightness of the display unit according to the first light sensed by the light-receiving portion of the illumination sensor.

6. The mobile terminal of claim 5, wherein the controller is further configured to control activation or deactivation of the brightness adjustment unit according to a changed intensity of the second light sensed by the light-receiving portion of the illumination sensor.

7. The mobile terminal of claim 6, wherein the controller is further configured to deactivate the brightness adjustment unit if an intensity of the second light sensed by the light-receiving portion of the illumination sensor is changed when the brightness adjustment unit is activated.

8. The mobile terminal of claim 1, further comprising:
    a dome switch configured to generate a push input signal according to the at least one key button being pressed,
    wherein the controller is further configured to apply a control command to components mounted on the terminal body according to the touch input signal and push input signal.

9. The mobile terminal of claim 8, wherein the controller is further configured to apply a different control command for each of a touch input, a push input, and a sequential push-and-touch input.

10. The mobile terminal of claim 9, wherein the touch input comprises a slide touch made by sliding a finger on the at least one key button and the controller is further configured to apply a different control command according to a direction of the slide touch.

11. The mobile terminal of claim 9, wherein:
    a plurality of key information is displayed on the at least one key button; and
    at least two of the touch input, push input, or sequential push-and-touch input are assigned to one of the plurality of key information.

12. The mobile terminal of claim 9, wherein the controller is further configured to apply a different control command according to a duration time of the push input or touch input.

13. The mobile terminal of claim 8, wherein one of the components mounted on the terminal body is a display unit for displaying visual information and the controller is further configured to apply a control command for controlling a screen display of the display unit according to the push input and touch input.

14. The mobile terminal of claim 13, wherein the control command comprises at least a command for restoring a preset screen during the execution of a specific mode, a command for executing a selected operation, a command for displaying upper-level items of a currently-executed function, a command for displaying a menu, a command for switching to a next or previous page, a command for moving a cursor or pointer, a command for scrolling the screen display in a specific direction, or a zoom-in or zoom-out command.

15. The mobile terminal of claim 13, wherein the touch input comprises a slide touch made by sliding a finger on the at least one key button and the slide touch is assigned to a command for deleting text in a text editing mode.

16. The mobile terminal of claim 15, wherein a plurality of key buttons are arranged to form at least one column on the terminal body and the text is deleted according to a number of text characters corresponding to a number of the slide-touched key buttons.

17. An input device, comprising:
- a key button formed of a transparent material and having an internal space;
- an illumination sensor located in the internal space and having a light-receiving portion, wherein the illumination sensor is configured to sense a first light and a second light, wherein the first light is ambient light;
- a light-emitting portion located at one side of the illumination sensor and configured to output the second light to the outside of the key button for detecting a touch applied to the key button;
- a spacer comprising an elastically deformable material that is positioned between the illumination sensor and an internal wall of the key button such that the spacer is located below the internal wall of the key button, the spacer configured to cover the illumination sensor in order to suppress shock transferred to the illumination sensor when a contact touch is received via the key button, the spacer including a through hole positioned over the light-receiving portion to transfer light to the light-receiving portion, and
- an input signal generation unit configured to generate a touch input signal according to light sensed at the light-receiving portion via the through hole, wherein a sensing of the first light at the light-receiving portion, via the through hole, is used for generating a first control command via a controller, and wherein a sensing of the second light at the light-receiving portion of the illumination sensor, via the through hole, is used for generating a second control command via the controller.

18. The input device of claim 17, wherein the light-emitting portion is an infrared-emitting module configured to emit infrared rays.

19. The input device of claim 17, wherein:
- the light-emitting portion comprises a first light-emitting portion mounted at a first side of the illumination sensor and a second light-emitting portion mounted at a second side of the illumination sensor to detect a slide touch applied to the key button; and
- the input signal generation unit generates a different input signal according to a direction of the slide touch.

* * * * *